(12) United States Patent
Watanabe et al.

(10) Patent No.: US 11,804,580 B2
(45) Date of Patent: Oct. 31, 2023

(54) LIGHTING DEVICE AND METHOD OF PRODUCING LIGHT SOURCE SUBSTRATE

(71) Applicant: SHARP KABUSHIKI KAISHA, Sakai (JP)

(72) Inventors: Hisashi Watanabe, Sakai (JP); Hirotoshi Yasunaga, Sakai (JP); Youzou Kyoukane, Sakai (JP); Takeshi Masuda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 302 days.

(21) Appl. No.: 17/085,418

(22) Filed: Oct. 30, 2020

(65) Prior Publication Data
US 2021/0135066 A1    May 6, 2021

Related U.S. Application Data

(60) Provisional application No. 62/930,390, filed on Nov. 4, 2019.

(51) Int. Cl.
| | |
|---|---|
| *H01L 33/50* | (2010.01) |
| *H01L 33/00* | (2010.01) |
| *H01L 33/60* | (2010.01) |
| *H01L 33/02* | (2010.01) |
| *G02F 1/13357* | (2006.01) |
| *G02F 1/1335* | (2006.01) |

(Continued)

(52) U.S. Cl.
CPC ........ *H01L 33/505* (2013.01); *H01L 33/0095* (2013.01); *H01L 33/502* (2013.01); *H01L 33/60* (2013.01); *H01L 33/62* (2013.01); *G02F 1/133603* (2013.01); *G02F 1/133605* (2013.01); *H01L 2933/0041* (2013.01); *H01L 2933/0058* (2013.01); *H01L 2933/0066* (2013.01)

(58) Field of Classification Search
CPC .... H01L 25/0753; H01L 33/54; H01L 33/502
See application file for complete search history.

(56) References Cited

U.S. PATENT DOCUMENTS

2009/0147497 A1* 6/2009 Nada ................. G02F 1/133609
                                                                362/351
2018/0292712 A1    10/2018 Kishimoto et al.
(Continued)

FOREIGN PATENT DOCUMENTS

| CN | 104006334 A * | 8/2014 | .............. F21V 29/70 |
|---|---|---|---|
| JP | 6092446 B1 | 3/2017 | |

*Primary Examiner* — Antonio B Crite
(74) *Attorney, Agent, or Firm* — ScienBiziP, P.C.

(57) ABSTRACT

A lighting device includes a circuit substrate that includes a wiring circuit, LEDs that are mounted on the circuit substrate and that emit primary light, a phosphor sheet that faces a light emission surface of each of the LEDs and that has a function of converting part of the primary light into secondary light in another wavelength range that differs from the wavelength range, and a selective reflection layer that is composed of dielectric multilayer film, that is disposed between the phosphor sheet and the LEDs, that covers the light emission surface of each of the LEDs, that allows the part of the primary light to be transmitted therethrough, and that reflects part of the secondary light. The selective reflection layer is disposed so as to have convex shapes projecting in a direction opposite a direction toward the circuit substrate in regions that overlap the LEDs.

7 Claims, 13 Drawing Sheets

(51) Int. Cl.
*H01L 25/075* (2006.01)
*H01L 33/54* (2010.01)
*H01L 33/46* (2010.01)
*H01L 33/62* (2010.01)

(56) References Cited

U.S. PATENT DOCUMENTS

2019/0285950 A1* 9/2019 Liu ................. H05K 3/3431
2019/0369441 A1 12/2019 Kishimoto et al.
2020/0006297 A1* 1/2020 Yamada ................ H01L 33/62
2020/0258869 A1* 8/2020 Wu .................. H01L 25/0753

* cited by examiner

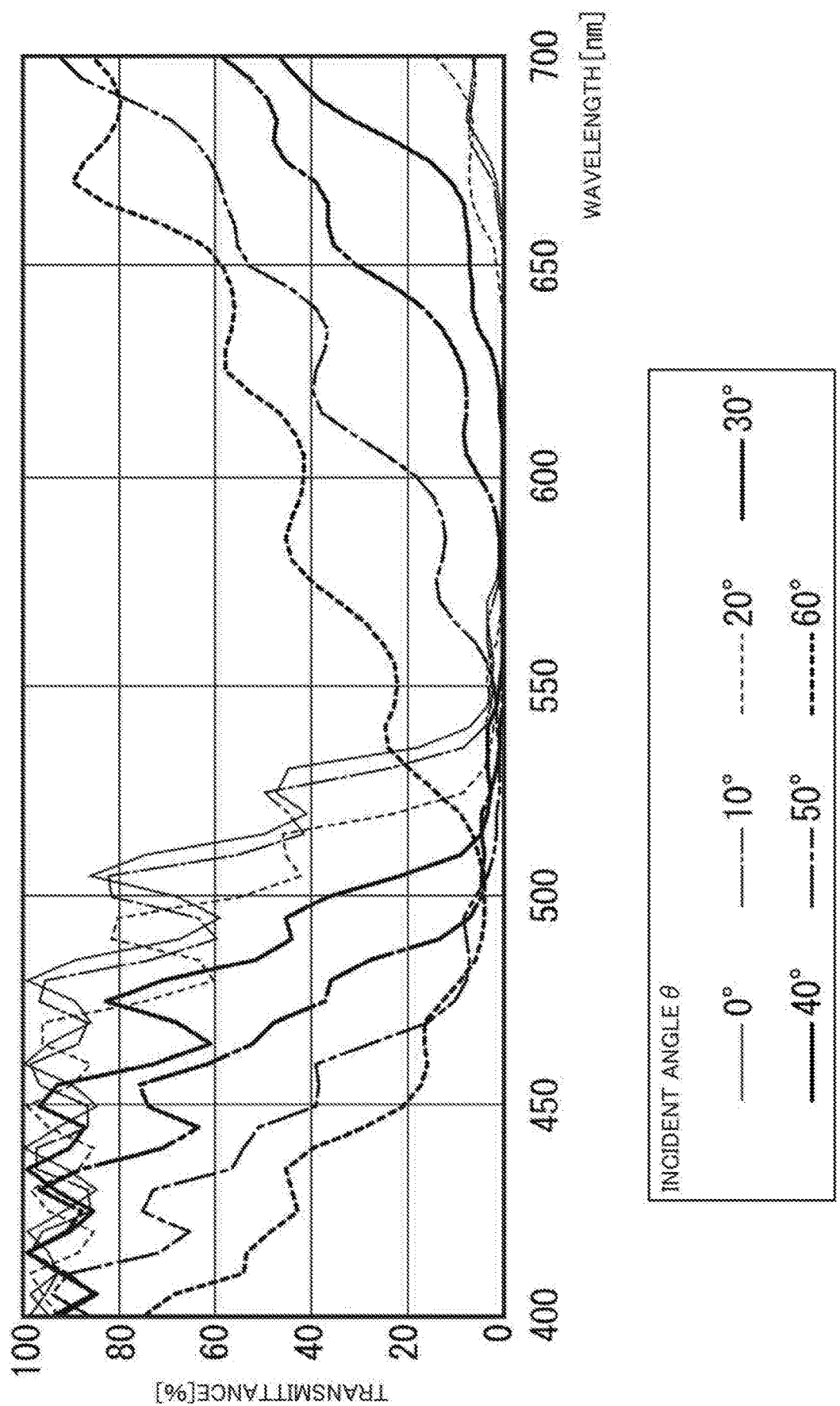

FIG.7

|  |  | THICKNESS $T_{56}$ OF TRANSPARENT RESIN LAYER | | |
|---|---|---|---|---|
|  |  | $H_{52}$ [※1] OR LESS | $H_{52} \sim 2H_{52}$ | $2H_{52}$ OR MORE |
| THICKNESS $T_{55}$ OF SELECTIVE REFLECTION LAYER | 12 μm OR LESS | ×[※2] | △-1 | △-2 |
| | 12 μm ~ 200 μm | × | ○ | △-2 |
| | 12 μm OR MORE | × | △-2 | △-2 |

※1 $H_{52}$: MOUNTING HEIGHT OF LED

※2 ○: WAVELENGTH-SELECTIVE LAYER HAS CONVEX SHAPE,
△-1: WRINKLE IS FORMED WHEN WAVELENGTH-SELECTIVE REFLECTION LAYER IS FORMED,
△-2: WAVELENGTH-SELECTIVE LAYER IS SUBSTANTIALLY FLAT,
×: BUBBLE REMAINS AROUND LED

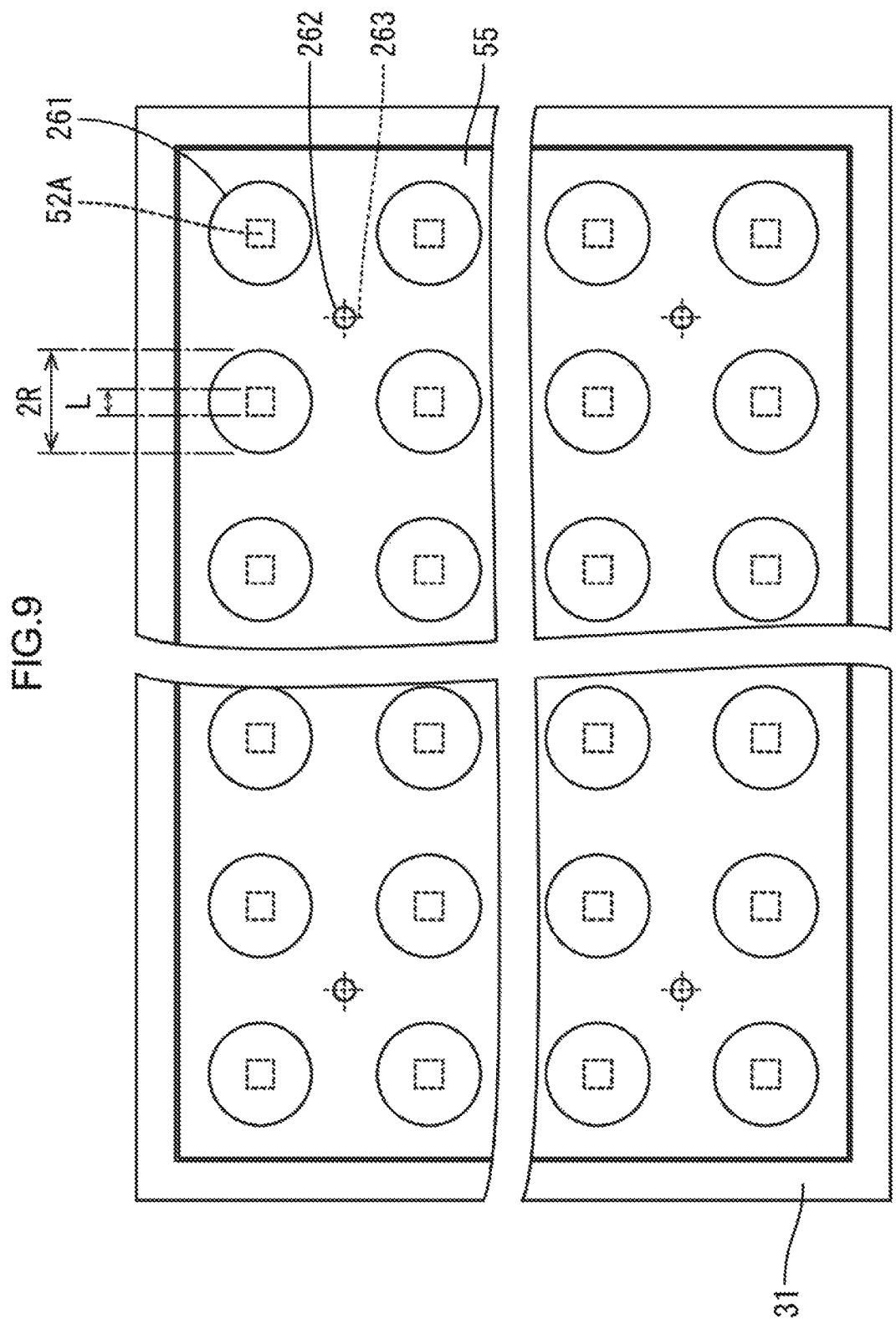

LIGHTING DEVICE AND METHOD OF PRODUCING LIGHT SOURCE SUBSTRATE

TECHNICAL FIELD

A technique disclosed according to the present specification relates to a lighting device and a method of producing a light source substrate.

BACKGROUND ART

Known lighting devices that are included in, for example, display devices use LEDs (light-emitting diodes) as light sources. Among these, a direct backlight that includes a combination of a LED that emits monochromatic primary light and a phosphor sheet attracts attention as a lighting device that achieves high luminance and high color reproducibility. The phosphor sheet is a wavelength conversion member that contains a phosphor material that absorbs light in a specific wavelength range and that converts the light into light in a different wavelength range, and the phosphor sheet absorbs, for example, blue light and radiates green light and red light equally in every direction. As for such a phosphor sheet, a surface that faces a light source substrate typically has a low reflectance, which causes a loss of light, and luminance tends to decrease. In view of this, a proposed technique for increasing light use efficiency includes disposing a wavelength-selective reflection layer between the phosphor sheet and the light source substrate. For example, PTL 1 described below discloses a partially driven light source device that includes a blue LED, a phosphor sheet that converts blue light into green light and red light, and a wavelength-selective reflection layer that allows blue light to be transmitted therethrough, that reflects green light and red light, and that is disposed on a surface of the phosphor sheet that faces a substrate.

CITATION LIST

Patent Literature

[PTL 1] Japanese Patent No. 6092446

Technical Problem

The wavelength-selective reflection layer is composed of dielectric multilayer film. In this case, a phenomenon of a shift in a reflection wavelength due to the incident angle of light is not avoidable. Specifically, the larger the incident angle θ (an angle that is formed between the normal to the wavelength-selective reflection layer and the incident direction of the light at a position that light reaches) of light that reaches the wavelength-selective reflection layer, the more the light at short wavelength such as blue light is likely to reflect, which is known as so-called "blue shift". In the case where a LED that emits light having a particularly high degree of straightness is used as a light source, a large amount of primary light reaches the wavelength-selective reflection layer at a small incident angle θ in a region right above the LED, but an increased amount of the primary light reaches the wavelength-selective reflection layer at a large incident angle θ as the distance from the led increases. For this reason, in a region away from the LED, a large amount of the primary light (blue light) is reflected due to the blue shift, the amount of light that is transmitted through the wavelength-selective reflection layer decreases, it is darker than in the region right above the LED, and luminance unevenness accelerates in some cases.

SUMMARY OF INVENTION

The present technique has been accomplished in consideration of, for example, the above circumstances, and it is an object of the present technique to provide a lighting device that inhibits the luminance unevenness.

Solution to Problem (1) According to an embodiment of a technique disclosed in the present specification, a lighting device includes a circuit substrate that includes a wiring circuit, a light source that is mounted on the circuit substrate and that emits primary light in a predetermined wavelength range via a light emission surface, a wavelength conversion member that faces a light emission surface of the light source and that has a function of converting part of the primary light into secondary light in another wavelength range that differs from the wavelength range, and a wavelength-selective reflection layer that is composed of dielectric multilayer film, that is disposed between the wavelength conversion member and the light source, that covers the light emission surface of the light source, that allows the part of the primary light to be transmitted therethrough, and that reflects part of the secondary light. The wavelength-selective reflection layer is disposed so as to have a convex shape projecting in a direction opposite a direction toward the circuit substrate in a region that overlaps the light source.

(2) In a lighting device according to an embodiment of the technique disclosed in the present specification, the light source is a blue light-emitting diode that emits blue light, and the wavelength conversion member has a function of converting part of the blue light into red light and green light, in addition to the structure of (1) described above.

(3) In a lighting device according to an embodiment of the technique disclosed in the present specification, a protrusion height of the convex shape is equal to a mounting height of the light source, in addition to the structure of (1) or (2) described above.

(4) in a lighting device according to an embodiment of the technique disclosed in the present specification, a plurality of the light sources is arranged at a certain array pitch and is mounted on the circuit substrate, and a distance between the light emission surface of each of the plurality of the light sources and the wavelength-selective reflection layer is less than ½ of the array pitch of the plurality of the light sources, in addition to the structure of any one of (1) to (3) described above.

(5) A lighting device according to an embodiment of the technique disclosed in the present specification further includes a transparent resin layer that is interposed between the circuit substrate and the wavelength-selective reflection layer and between the light source and the wavelength-selective reflection layer and that secures the wavelength-selective reflection layer to the circuit substrate, in addition to the structure of any one of (1) to (4) described above.

(6) In a lighting device according to an embodiment of the technique disclosed in the present specification, the transparent resin layer is composed of transparent, adhesive resin having adhesiveness, in addition to the structure of (5) described above.

(7) In a lighting device according to an embodiment of the technique disclosed in the present specification, a thickness of the transparent resin layer is more than one time a mounting height of the light source and less than two times the mounting height, in addition to the structure of (5) or (6) described above.

(8) A lighting device according to an embodiment of the technique disclosed in the present specification further includes a transparent base material that is interposed between the transparent resin layer and the wavelength-selective reflection layer, in addition to the structure of any one of (5) to (7) described above.

(9) In a lighting device according to an embodiment of the technique disclosed in the present specification, a light reflection layer that reflects light is formed on the transparent base material in the region that overlaps the light source, in addition to the structure of (8) described above.

(10) In a lighting device according to an embodiment of the technique disclosed in the present specification, a light reflection layer that reflects light is formed on the wavelength-selective reflection layer in the region that overlaps the light source, in addition to the structure of any one of (1) to (8) described above.

(11) In a lighting device according to an embodiment of the technique disclosed in the present specification, the light reflection layer is formed so as to cover the entire light emission surface of the light source, in addition to the structure of (9) or (10) described above.

(12) In a lighting device according to an embodiment of the technique disclosed in the present specification, the light reflection layer has a disk shape, and a center of the light reflection layer is located so as to overlap a center of light emission of the light source in a plan view of the circuit substrate, in addition to the structure of any one of (9) to (11) described above.

(13) In a lighting device according to an embodiment of the technique disclosed in the present specification, the wavelength-selective reflection layer is formed by using a wavelength-selective reflection sheet that has a sheet shape, and a positioning mark that is used to attach the wavelength-selective reflection sheet at a predetermined position on the circuit substrate and that is composed of a same material as that of the light reflection layer is formed on the wavelength-selective reflection sheet, in addition to the structure of any one of (9) to (12) described above.

(14) According to an embodiment of the technique disclosed in the present specification, a method of producing a light source substrate includes a light source mounting step of mounting light sources on a circuit substrate that has a wiring path to manufacture a light source mounting substrate, a single-sided adhesive, wavelength-selective reflection sheet manufacturing step of providing an adhesive resin layer having adhesiveness on a single surface of a wavelength-selective reflection sheet having no adhesiveness such that a thickness is no less than one time a mounting height of the light sources and no more than two times the mounting height to manufacture a single-sided adhesive, wavelength-selective reflection sheet, and a wavelength-selective reflection layer attaching step of attaching the single-sided adhesive, wavelength-selective reflection sheet to the light source mounting substrate by pressure bonding such that the single-sided adhesive, wavelength-selective reflection sheet covers the light sources.

(15) According to an embodiment of the technique disclosed in the present specification, a method of producing a light source substrate includes a light source mounting step of mounting light sources on a circuit substrate that has a wiring path to manufacture a light source mounting substrate, a single-sided adhesive, transparent base material sheet manufacturing step of providing a transparent resin layer having adhesiveness on a single surface of a transparent base material sheet having no adhesiveness such that a thickness is no less than one time a mounting height of the light sources and no more than two times the mounting height to manufacture a single-sided adhesive, transparent base material sheet, a transparent base material attaching step of attaching the single-sided adhesive, transparent base material sheet to the light source mounting substrate by pressure bonding such that the single-sided adhesive, transparent base material sheet covers the light sources, and a wavelength-selective reflection layer providing step of providing a wavelength-selective reflection layer on the transparent base material sheet that is attached to the light source mounting substrate.

Advantageous Effects of Invention

According to the present technique, a lighting device that inhibits the luminance unevenness can be obtained.

BRIEF DESCRIPTION OF DRAWINGS

FIG. 3 is a graph illustrating angular dependence of light transmittance of a reflection layer that is wavelength-selective.

FIG. 7 is a table illustrating a relationship between the structure of the single-sided adhesive reflection sheet and an attachment state.

FIG. 9 schematically illustrates a planar structure of a led substrate.

DESCRIPTION OF EMBODIMENTS

First Embodiment

Figure 1:
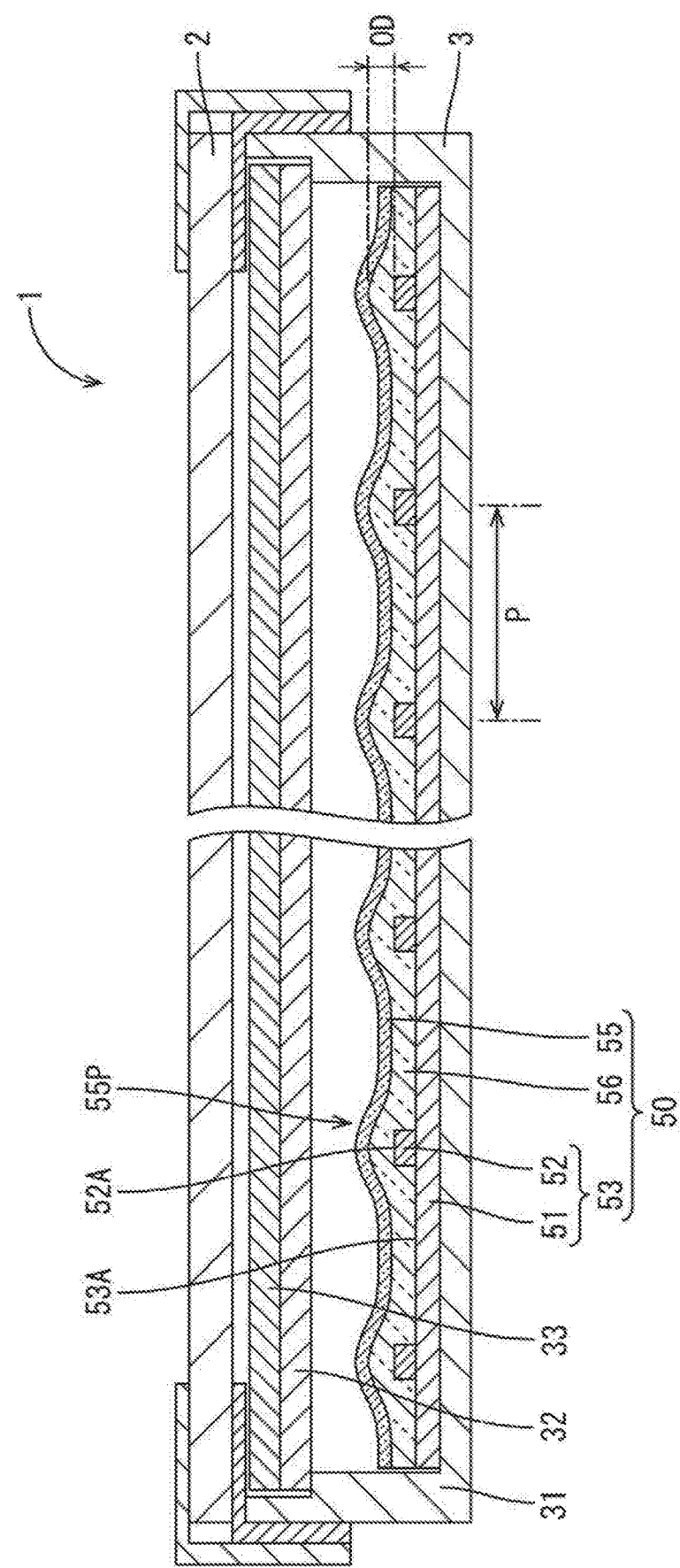
FIG. 1 schematically illustrates a sectional structure of a display device according to a first embodiment.

A first embodiment will be described with reference to FIG. 1 to FIG. 7. In the following description, an upper direction in, for example, FIG. 1 is defined as a front direction or a front surface direction (a lower direction is defined as a rear direction or a back surface direction), and as for like components, one of the components is designated by a reference sign, and a sign for the other component is omitted in some cases. Relative sizes and arrangement of components in the drawings are not necessarily accurate, and the scale of some components is changed for convenience of description.

According to the present embodiment, a lighting device (a backlight device) 3 that is used in a display device 1 will be described by way of example. As illustrated in FIG. 1, the display device 1 includes a liquid crystal panel 2 that is a display panel and the lighting device 3 that uses LEDs as light sources. Of a pair of plate surfaces of the liquid crystal panel 2, a plate surface that faces in the front direction is referred to as an image display surface, and the lighting device 3 is secured to the back surface of the liquid crystal panel 2 by using, for example, a frame or a bezel. The display device 1 can be widely used for, for example, a television receiver, a tablet terminal, a car navigation system, a smart phone, or head-mounted display.

The liquid crystal panel 2 according to the present embodiment is a transmissive liquid crystal panel. A known liquid crystal panel can be used as the liquid crystal panel 2 without limitation. An example of the liquid crystal panel 2 is a liquid crystal panel in which a pair of glass substrates is bonded with a predetermined gap formed therebetween, and a liquid crystal is sealed between the glass substrates. One of the glass substrates includes a switching element (for example, a TFT) that is connected to a source wiring line and a gate wiring line that are perpendicular to each other, a pixel electrode that is connected to the switching element, an alignment film, and another component. The other glass substrate includes a color filter in which coloring members for, for example, R (red), G (green), and B (blue) are arranged in a predetermined array, a facing electrode, an alignment film, and another component. One of the glass substrates may include a pair of electrodes of a pixel electrode and a common electrode, and the other substrate may include no electrode. A polarizer is disposed outside both of the substrates. The drive of the liquid crystal panel 2 is controlled based on an electrical signal from an external signal source. In conjunction with the control of the liquid crystal panel 2, light is provided from the lighting device 3, and a desired image is displayed on the image display surface of the liquid crystal panel 2.

A schematic structure of the lighting device 3 will be described with reference to FIG. 1. The lighting device 3 according to the first embodiment is a so-called direct backlight device in which LEDs (an example of a light source) 52 are disposed right below the liquid crystal panel 2. The lighting device 3 includes a substantially box-shaped chassis 31 that is shallow and that has an opening portion at the front (near the liquid crystal panel 2). The chassis 31 is a member that holds an optical member and is preferably formed by molding resin having a high reflectance, such as white polycarbonate resin by using a mold. The chassis 31 contains a LED substrate (an example of a light source substrate) 50 described later.

The lighting device 3 includes a phosphor sheet (an example of a wavelength conversion member) 32 and an optical sheet 33 that cover the opening portion at the front of the chassis 31. The phosphor sheet 32 has a function of absorbing light emission wavelength of the LEDs 52, emitting light of complementary color, and whitening light to be radiated. For example, in the case where the LEDs 52 emit blue light as primary light, a sheet that is produced by dispersing a phosphor material that emits light of yellow or red and green in, for example, resin is used. Examples of the phosphor material include inorganic phosphor, organic phosphor, and a quantum dot material (QD). Specifically, a light conversion sheet QDEF (Quantum Dot Enhancement Film) that uses quantum dots produced by 3M Company can be used as the phosphor sheet 32. The optical sheet 33 has a function of changing light that is emitted from the LEDs 52 that are point light sources into uniform light that is emitted from the surface light sources. A diffuser panel, a diffuser sheet, a prism sheet, or a polarization reflection sheet, for example, is used as the optical sheet 33 as needed. The diffuser panel and the diffuser sheet are used to inhibit light unevenness from occurring and specifically, a sumipex (registered trademark) opal sheet produced by Sumitomo Chemical Co., Ltd. or D114 produced by TSUJIDEN CO., LTD., for example, can be used. The prism sheet and the polarization reflection sheet are used to increase luminance, and sheets in a BEF (registered trademark) series produced by 3M Company or in a DBEF (registered trademark) series produced by 3M Company can be used. As for the phosphor sheet 32 and the optical sheet 33, the phosphor sheet 32, the optical sheet 33 (the diffuser sheet, the prism sheet, the prism sheet, or the polarization reflection sheet) are typically stacked in this order in the back surface direction (a direction toward the LEDs 52). A part of the optical sheet 33 may be disposed below the phosphor sheet 32. The light that is emitted from the LEDs 52 passes through the phosphor sheet 32 and the optical sheet 33 and becomes uniform light in a planer form, which is radiated to the liquid crystal panel 2 via the back surface.

The LED substrate 50 according to the present embodiment will now be described with reference to FIG. 1 and FIG. 2. The LED substrate 50 includes a LED mounting substrate (an example of a light source mounting substrate) 53 in which the LEDs 52 are mounted on a circuit substrate 51, a selective reflection layer (an example of a wavelength-selective reflection layer) 55, and a transparent resin layer 56. These will be described below in order.

A typical circuit substrate composed of, for example, glass epoxy, polyimide, or aluminum can be used for the circuit substrate 51. A wiring circuit is formed on the circuit substrate 51, and electrode pads 54 (see FIG. 2) that are used to mount the LEDs 52 are disposed at a predetermined interval. The LEDs 52 are electrically connected to the wiring circuit with the electrode pads 54 interposed therebetween and are connected to a power supply by using, for example, cables. In the following description, a surface (a surface on which the electrode pads 54 are formed) of the LED mounting substrate 53 to which the LEDs 52 are connected is referred to as a mounting surface 53A in some cases. The wiring circuit is preferably formed so as to be capable of individually controlling and applying electric current from the power supply to the LEDs 52. Surfaces of the circuit substrate 51 other than the surface to which the electrode pads 54 are connected are preferably painted in white to increase a light reflectance. White resist PSR-4000 produced by TAIYO HOLDINGS CO., LTD., for example, can be used for painting.

In the LED substrate 50 according to the present embodiment, the LEDs 52 that serve as the light sources emit monochromatic primary light in a predetermined wavelength range. Known LEDs can be used as the LEDs 52 without limitation, and a large number of small LEDs 52 such as LED bare chips are preferably arranged and used. The LEDs 52 are typically blue LEDs the light emission peak wavelength of which is, for example, 450 nm. Connection surfaces of rear surfaces of the LEDs 52 are electrically connected to the electrode pads 54 on the circuit substrate 51. Each LED 52 is broadly classified into a top surface LED in which a light emission surface via which light is emitted is opposite the connection surface and a side surface LED in which the light emission surface is adjacent to the connection surface. The led 52 is preferably the top surface LED in which a light emission surface 52A is opposite the connection surface and faces the phosphor sheet 32.

In the LED substrate 50 according to the present embodiment, the selective reflection layer 55 is disposed so as to cover at least the light emission surface 52A of the LEDs 52 that faces in the front direction. The selective reflection layer 55 according to the present embodiment allows at least part of the blue light that is emitted from the LEDs 52 to be transmitted therethrough and has a function of reflecting part of colored light that is converted into red light and green light by using the phosphor sheet 32. The selective reflection layer 55 contains dielectric multilayer film that has a multilayer body of transparent/thin films having a specific refractive index and thickness. A specific example is an optical filter (a dichroic filter) that reflects light in a specific wavelength range and that allows light in the other wavelength range to be transmitted therethrough by using light interference due to the thin films.

As illustrated in a graph in FIG. 3, the reflection properties and transmission properties of the selective reflection layer 55 composed of the dielectric multilayer film change depending on the incident angle $\theta$ of light. As described above, there is a known phenomenon in which the larger an angle at which the light diagonally enters, that is, the larger the incident angle $\theta$, the more the light at short wavelength such as the blue light is likely to reflect, which is typically called blue shift.

Figure 4A:
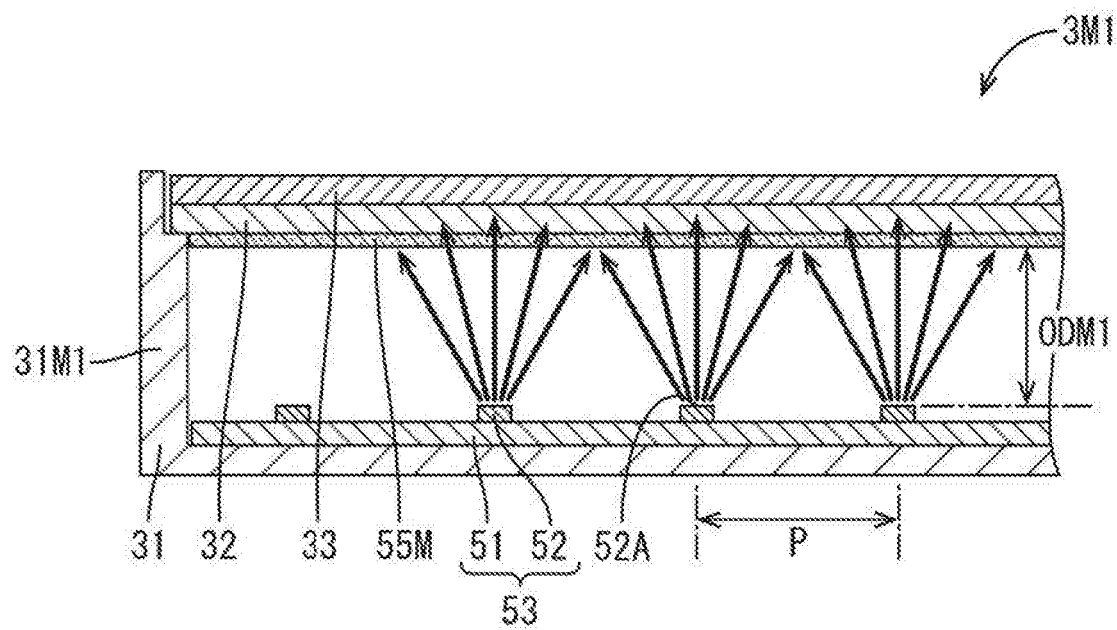
FIG. 4A schematically illustrates an optical path for primary light in a model lighting device 3M1.
Figure 4B:
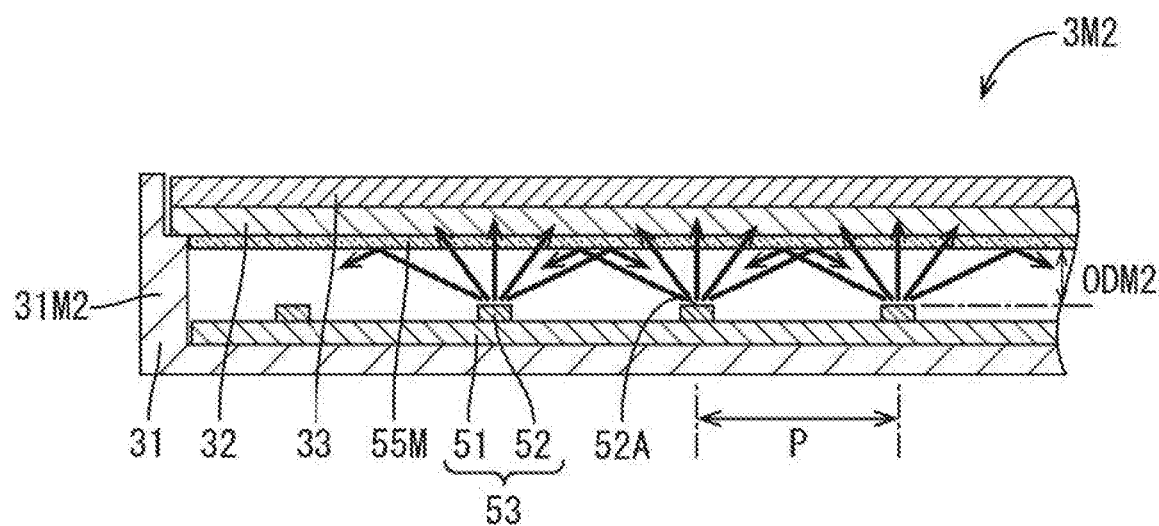
FIG. 4B schematically illustrates an optical path for primary light in a model lighting device 3M2.
Figure 5:
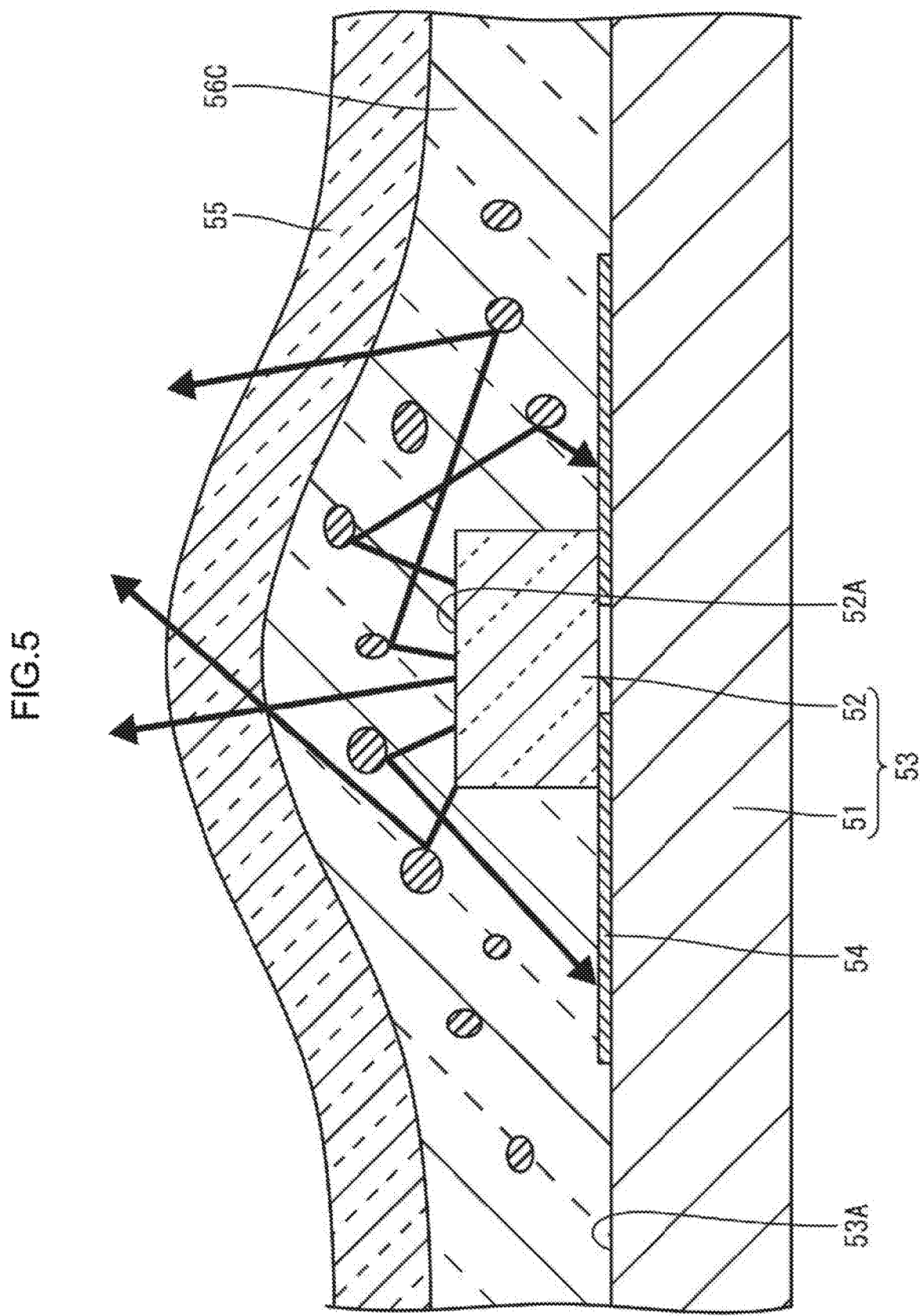
FIG. 5 schematically illustrates an optical path for primary light in a LED substrate that includes a comparison transparent resin layer that contains diffusing particles near a position at which a LED is disposed.

The influence of the blue shift on the lighting device 3 that includes the selective reflection layer 55 is considered by using model lighting devices 3M1 and 3M2 illustrated in FIG. 4A and FIG. 4B. Each of the model lighting devices 3M1 and 3M2 is a direct backlight device in which the LEDs 52 that emit blue light and that serve as the light sources are arranged on the circuit substrate 51 as in the lighting device 3 according to the present embodiment, in the following description, components of the model lighting devices 3M1 and 3M2 like to those according to the present embodiment are designated by like reference signs, and a description thereof is omitted. As for each of the model lighting devices 3M1 and 3M2, the LED mounting substrate 53 in which the LEDs 52 are mounted on the circuit substrate 51 is contained in chassis 31M1 or 31M2, and the optical sheet 33 and the phosphor sheet 32 are disposed so as to cover the opening portion at the front of the chassis 31M1 or 31M2 as in the lighting device 3 according to the present embodiment. Each of the model lighting devices 3M1 and 3M2 includes a comparison selective reflection layer 55M that is wavelength-selective and that has the same function as that of the selective reflection layer 55 according to the present embodiment. However, the comparison selective reflection layer 55M is disposed right below the phosphor sheet 32 so as to be substantially parallel to the mounting surface 53A of the LED mounting substrate 53 and so as to have a flat shape unlike a state in which the selective reflection layer 55 is disposed, which will be described later. The model lighting devices 3M1 and 3M2 include no transparent resin layers unlike the lighting device 3.

The model lighting device 3M2 is thinner than the model lighting device 3M1. That is, the chassis 31M2 has a depth of substantially ½ of that of the chassis 31M1. Consequently, as for the distance from the LED mounting substrate 53, more specifically, the light emission surface 52A of the LEDs 52 to the comparison selective reflection layer 55M, that is, an optical path length OD (an optical distance) needed until the primary light that is emitted from the LEDs 52 is incident on the comparison selective reflection layer 55M, an optical path length ODM2 in the model lighting device 3M2 is less than an optical path length ODM1 in the model lighting device 3M1 (ODM1>ODM2).

In the case where the optical path length OD needed until the light that is emitted from the LEDs 52 is incident on the comparison selective reflection layer 55M is sufficiently long in relation to the array pitch P of the LEDs 52 (ODM1>>P) as in the model lighting device 3M1 illustrated in FIG. 4A, the primary light that is emitted from the LEDs 52 complements each other, the primary light (the blue light) enters at various angles over the entire comparison selective reflection layer 55M and is made uniform, and luminance unevenness due to the blue shift is consequently unlikely to be revealed.

However, in the case where the optical path length ODM2 is short as in the model lighting device 3M2 illustrated in FIG. 4B, the luminance unevenness is recognized depending on relative arrangement of the LEDs 52. Decrease in the optical path length ODM2 makes it difficult to complement the light from the LEDs 52 close to each other, a large amount of the primary light reaches the comparison selective reflection layer 55M at a small incident angle $\theta$ in regions right above the LEDs 52. However, the longer the distances from the LEDs 52, the more the amount of the primary light that reaches the comparison selective reflection layer 55M at a large incident angle $\theta$. For this reason, in regions away from the LEDs, a large amount of the primary light (the blue light) is reflected due to the blue shift, the amount of light that is transmitted through the comparison selective reflection layer 55M decreases, the amount of the light that is transmitted has distribution, and the luminance unevenness is accelerated. A standard is that when the optical path length OD is less than ½ of the array pitch P of the LEDs 52 (ODM2<(P/2)), the luminance unevenness is revealed, and the shorter the optical path length OD, the more the unevenness is remarkable. Accordingly, in the case of a lighting device in which the comparison selective reflection layer 55M is parallel to the mounting surface 53A of the LED mounting substrate 53 as in the model lighting device 3M2, it is difficult to inhibit the luminance unevenness from occurring with the size of the optical path length OD decreased for thinning.

Figure 2:
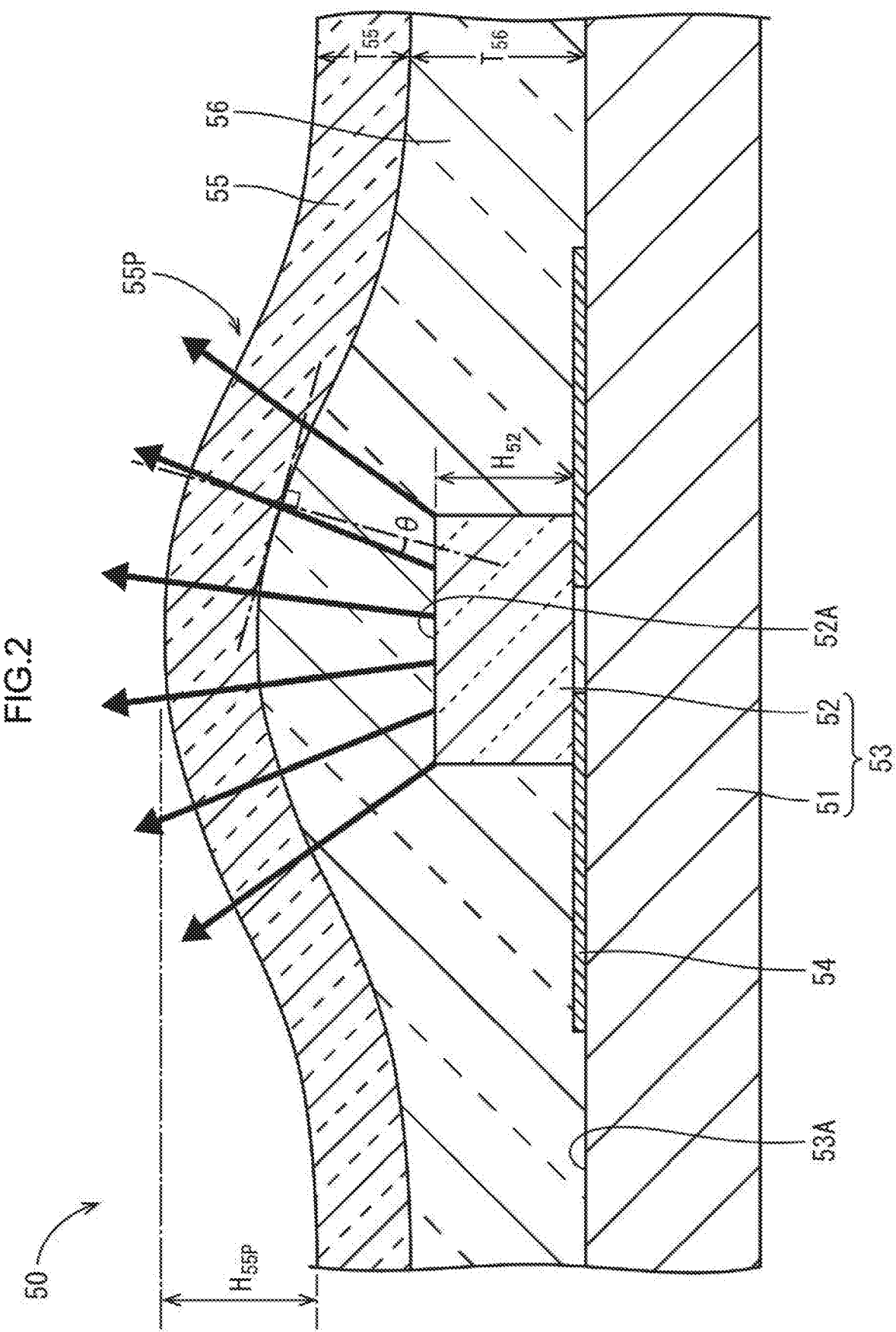
FIG. 2 schematically illustrates a sectional structure of a LED substrate according to the first embodiment near a position at which a led is disposed.

In the lighting device 3 according to the present embodiment illustrated in FIG. 1, FIG. 2, and other figures, however, the selective reflection layer 55 is disposed on the LED substrate 50 such that convex shapes 55P projecting in a direction opposite a direction toward the circuit substrate 51 are formed in regions that overlap the LEDs 52. The formation of the convex shapes 55P enables a large amount of the primary light that is emitted from the LEDs 52 to be incident on the selective reflection layer 55 at a small incident angle θ even in the regions away from right above the LEDs 52, and the influence of the angle properties of the dielectric multilayer film is consequently reduced. As a result, the amount of the light that is transmitted in the regions away from right above the LEDs 52 is inhibited from decreasing, the optical path length OD, for example, can be less than ½ of the array pitch P of the LEDs 52 (OD<(P/2)), and the luminance unevenness is inhibited from occurring. The lighting device 3 according to the present embodiment can thus be thin, inhibit light use efficiency from decreasing, and decrease the luminance unevenness.

The convex shapes 55P preferably have surfaces having shapes following the external forms of the respective LEDs 52. Here, "to have shapes following the external forms" is not limited to the case where the surface of each convex shape 55P has a shape similar to the external form of a respective one of the LEDs 52 but includes the case where the distance from the LED 52 to the surface of the selective reflection layer 55 that has the convex shape 55P is within a certain range (for example, a difference between the maximum and the minimum of the distance is within 30% of the maximum). For example, in the case where the external form of the led 52 is a rectangular cuboid shape, the convex shape 55P may be defined by a curved surface roughly following surfaces thereof. Specifically, the surface of the convex shape 55P may has, for example, a hemispherical shape, a polygonal prism shape, a columnar shape, a polygonal pyramid shape, or a conical shape. From the perspective that the incident angle θ is decreased, and the amount of reflection light is decreased, as illustrated in FIG. 2, the surface of the selective reflection layer 55 that has the convex shape 55P is particularly preferably formed in a substantially hemispherical shape (a convex lens shape).

Each convex shape 55P is preferably formed such that a protrusion height $H_{55P}$ from the surface of the selective reflection layer 55 at a position at which the LED 52 is not embedded is equal to the mounting height $H_{52}$ of the LED 52 ($H_{55P}=H_{52}$). Here, "being equal" means not only being completely equal but also being substantially equal. For example, in the case where the selective reflection layer 55 and the transparent resin layer 56 are secured in the LED substrate 50 by attaching a single-sided adhesive reflection sheet 70 as described later, an error, for example, can be made due to unintentional variation in the thickness of an adhesive resin layer 72 that is disposed on a reflection sheet 71 of the single-sided adhesive reflection sheet 70 or deformation of the adhesive resin layer 72 caused when the single-sided adhesive reflection sheet 70 is bonded by pressure bonding. The convex shape 55P can have the shape following the external form of the LED 52 by forming the convex shape 55P such that the protrusion height $H_{55P}$ is equal to the mounting height $H_{52}$ of the LED 52. Consequently, the incident angle θ can be decreased, the amount of the reflection light can be decreased, the light use efficiency can be increased, and the luminance unevenness can be inhibited from occurring.

The thickness $T_{55}$ of the selective reflection layer 55 is preferably more than 12 μm and less than 200 μm (12 μm<$T_{55}$<200 μm). This range enables the selective reflection layer 55 to have appropriate ability to maintain form and enables the convex shape 55P that follows the external form of the LED 52 to be readily formed, which will be described in detail later with reference to a table in FIG. 7.

In the LED substrate 50 according to the first embodiment, the transparent resin layer 56 is disposed on the mounting surface 53A of the LED mounting substrate 53. The selective reflection layer 55 described above is secured to the mounting surface 53A with the transparent resin layer 56 interposed therebetween. The transparent resin layer 56 is preferably disposed over the LEDs 52 so as to be close contact with, for example, the side surfaces and upper surfaces among the surfaces of the LEDs 52 except for the connection surfaces on the circuit substrate 51 such that the LEDs 52 are embedded.

The transparent resin layer 56 is preferably composed of, for example, resin having a high refractive index. The reason is that the high refractive index enables the efficiency of light emission from the LEDs 52 to increase, enables the amount of the primary light that is incident on the selective reflection layer 55 to increase, and enables the light use efficiency to increase. Specifically, the refractive index of the transparent resin layer 56 is preferably more than 1.

The transparent resin layer 56 is preferably composed of, for example, resin having high transparency and a low degree of haze. The reason is that the low degree of haze of the transparent resin layer 56 enables the light that is emitted from the LEDs 52 to propagate to a far location. In the case where light diffusing particles DP composed of titanium oxide, for example, are introduced into the layer, and the degree of haze is high as in, for example, a comparison transparent resin layer 56C illustrated in FIG. 5, there is a possibility that the primary light that is emitted from, the LEDs 52 diffuses in the comparison transparent resin layer 56C near the LEDs 52, enters the LEDs 52 again or is absorbed by the electrode pads 54 that are disposed on the circuit substrate 51 or by a structure having a low reflectance such as solder, and the light use efficiency consequently decreases, although this depends on, for example, the concentration of the light diffusing particles. Specifically, the degree of haze of the transparent resin layer 56 is preferably 30% or less.

The transparent resin layer 56 is preferably composed of transparent, adhesive resin having adhesiveness. This enables the selective reflection layer 55 having no adhesiveness to be adhesively secured to the mounting surface 53A by using the transparent resin layer 56. An adhesive typically called OCA (Optical Clear Adhesive), for example, can be used for the transparent, adhesive resin. To secure the selective reflection layer 55 firmly to the LED mounting substrate 53 such that the selective reflection layer 55 is not separated, the adhesive strength of the transparent resin layer 56 to the LED mounting substrate 53 is preferably 10 N/cm or more.

The transparent resin layer 56 is preferably composed of at least a resin material selected from the group consisting of acrylic resin, epoxy resin, urethane resin, and silicone resin. These resin materials may be combined for use. The use of the resin not only enables the refractive index, the transparency, and the adhesive strength to be high but also enables the transparent resin layer 56 with excellent heat resistance and excellent light fastness to be formed.

The transparent resin layer 56 is preferably formed so as to have a certain thickness $T_{56}$. The reason is that the transparent resin layer 56 can be in close contact with the LEDs 52 without any gap therearound, and all of the surfaces of the LED 52 except for the connection surfaces on the circuit substrate 51 can be readily covered. Specifically, the thickness $T_{56}$ of the transparent resin layer 56 is preferably more than one time the mounting height $H_{52}$ of the LEDs 52 and less than two times the mounting height $H_{52}$ ($H_{52}<T_{56}<2H_{52}$). Specifically, when the thickness $T_{56}$ of the transparent resin layer 56 is more than the mounting height $H_{52}$ of the LEDs 52 ($H_{52}<T_{56}$), spaces around the LEDs 52 can be readily filled with the transparent resin layer 56 without any gap, which will be described in detail later with reference to the table in FIG. 7. when the thickness $T_{56}$ of the transparent resin layer 56 is less than two times the mounting height $H_{52}$ of the LEDs 52 ($T_{56}<2H_{52}$), the selective reflection layer 55 can be readily secured to the LED mounting substrate 53 such that the convex shapes 55P following the external forms of the LEDs 52 are formed.

Figure 6A:
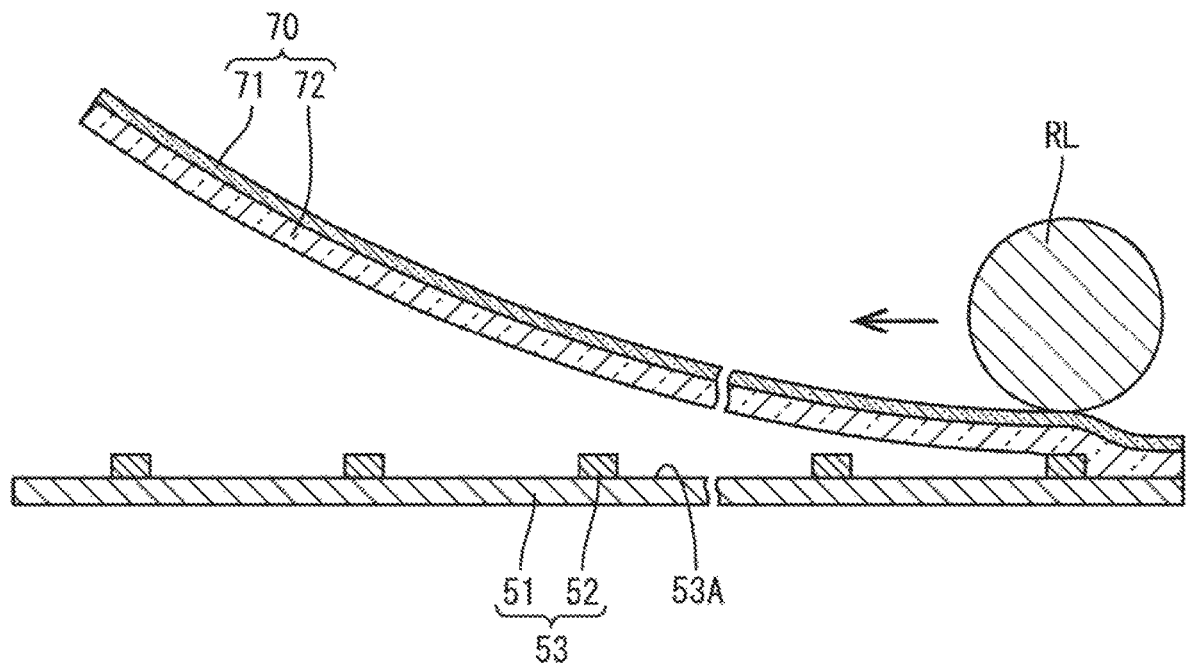
FIG. 6A illustrates an example of a step of attaching a single-sided adhesive reflection sheet.
Figure 6B:
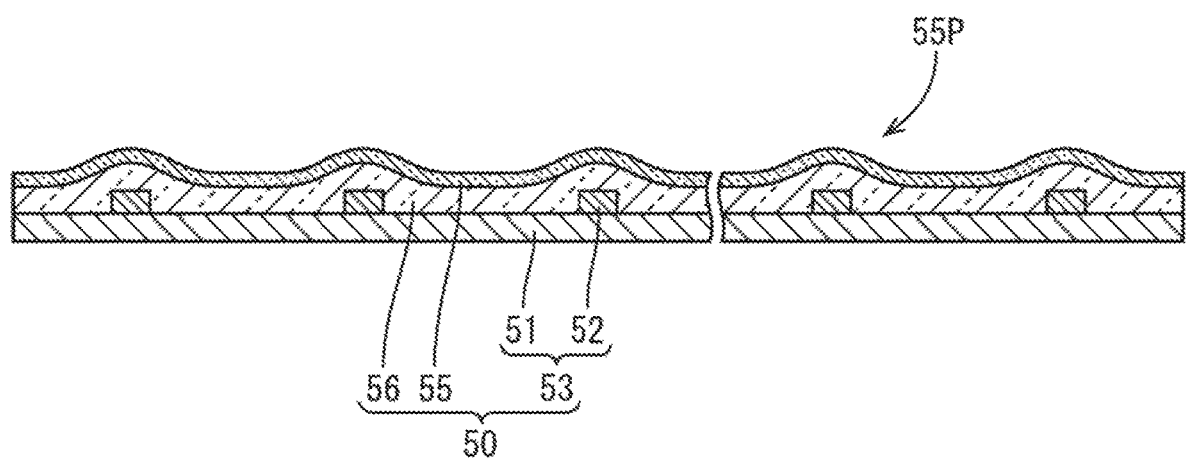
FIG. 6B schematically illustrates a sectional structure of the LED substrate after the single-sided adhesive reflection sheet is attached.

An example of a method of producing the LED substrate 50 having the structure described above will now be described with reference to FIG. 6A and FIG. 6B. In particular, an example of a method of providing the transparent resin layer 56 and the selective reflection layer 55 will be described below. Before the transparent resin layer 56 and the selective reflection layer 55 are provided, the LEDs 52 are mounted on the circuit substrate 51 that has the wiring path to manufacture the LED mounting substrate 53 (a light source mounting step). The LEDs 52 can be mounted by a known method without limitation, and the connection surfaces of the LEDs 52 are connected to the electrode pads 54 of the circuit substrate 51 by using, for example, solder.

The reflection sheet (an example of a wavelength-selective reflection sheet) 71 that has no adhesiveness and that is used to form the selective reflection layer 55 is prepared. Transparent resin having adhesiveness is applied with a substantially uniform thickness to a single surface thereof to form the adhesive resin layer 72, and the single-sided adhesive reflection sheet (an example of a single-sided adhesive, wavelength-selective reflection sheet) 70 is consequently manufactured (a single-sided adhesive, wavelength-selective reflection sheet manufacturing step). The thickness of the reflection sheet 71 that is included in the single-sided adhesive reflection sheet 70, that is, the selective reflection layer 55 and the thickness $T_{56}$ of the adhesive resin layer 72, that is, the transparent resin layer 56 will be considered later.

The single-sided adhesive reflection sheet 70 thus manufactured is placed on the mounting surface 53A of the LED mounting substrate 53 such that the adhesive resin layer 72 faces downward (in the direction toward the LED mounting substrate 53). As illustrated in FIG. 6A, a surface of the reflection sheet 71 of the single-sided adhesive reflection sheet 70 is pressed by using, for example, a roller RL, pressure bonding is performed for attachment such that spaces between the LEDs 52 are sealed with the adhesive resin, while the adhesive resin layer 72 is deformed, and air is pushed out (a wavelength-selective reflection layer attaching step). Pressure and speed during pressure bonding may be appropriately adjusted depending on the adhesive resin of which the adhesive resin layer 72 is composed or properties of the reflection sheet 71. In the case where bubbles remain between the adhesive resin layer 72 and the LEDs 52 or the mounting surface 53A, an autoclave process is preferably performed in appropriate conditions to eliminate the bubbles. The adhesive resin layer 72 that is transparent is thus provided such that each LED 52 is embedded on the mounting surface 53A of the LED mounting substrate 53, and the reflection sheet 71 is secured to the surface thereof.

When the properties and application amount of the adhesive resin layer 72 and the reflection sheet 71, for example, are appropriately adjusted to manufacture the single-sided adhesive reflection sheet 70 in the above description, the single-sided adhesive reflection sheet 70 can be attached to the mounting surface 53A of the LED mounting substrate 53 by pressure bonding while the single-sided adhesive reflection sheet 70 is deformed so as to follow the external forms of the LEDs 52. As a result, as illustrated in FIG. 6B, the LED substrate 50 is produced such that the LED substrate 50 includes the selective reflection layer 55 that has the convex shapes 55P projecting in the direction opposite the direction toward the circuit substrate 51 with the respective LEDs 52 centered.

The table in FIG. 7 illustrates the influence of the thickness $T_{56}$ of the adhesive resin layer 72, that is, the transparent resin layer 56 and the thickness $T_{55}$ of the reflection sheet 71, that is, the selective reflection layer 55 when the selective reflection layer 55 is secured with the transparent resin layer 56 interposed therebetween by the method of attaching the single-sided adhesive reflection sheet 70 by pressure bonding.

In many cases where the thickness $T_{56}$ of the transparent resin layer 56 is equal to or less than the mounting height $H_{52}$ of the LEDs 52 ($T_{56} \leq H_{52}$), bubbles remain around the LEDs 52, the spaces are not successfully filled even when the autoclave process is performed, and the bubbles remain. In the case where the thickness $T_{56}$ is equal to or more than two times the mounting height $H_{52}$ ($T_{56} \geq 2H_{52}$), the selective reflection layer 55 becomes substantially flat because the single-sided adhesive reflection sheet 70 is unlikely to deform so as to follow the external forms of the LEDs 52, and the convex shapes 55P cannot be intentionally formed.

In the case the thickness $T_{56}$ is more than the mounting height $H_{52}$ and less than two times the mounting height $H_{52}$ ($H_{52}<T_{56}<2H_{52}$), however, the selective reflection layer 55 can be secured such that the convex shapes 55P are formed by adjusting the thickness $T_{55}$ of the selective reflection layer 55. Even when some bubbles remain around the LEDs 52 after the single-sided adhesive reflection sheet 70 is attached, the bubbles can be eliminated by performing the autoclave process in appropriate conditions. Examples of the appropriate conditions for the autoclave process include 45° C., 0.5 MPa, and 20 minutes.

It can be said from these results that the thickness $T_{56}$ of the transparent resin layer 56 is preferably more than one time the mounting height $H_{52}$ of the LEDs 52 and less than two times the mounting height $H_{52}$ ($H_{52}<T_{56}<2H_{52}$), as described above.

In the case where the thickness $T_{55}$ of the selective reflection layer 55 is 12 μm or less in the above description ($T_{55} \leq 12$ μm), the single-sided adhesive reflection sheet 70 does not sufficient ability to maintain form, and a wrinkle is formed during attachment. In the case where the thickness $T_{55}$ is 200 μm or more ($T_{55} \geq 200$ μm), there is a tendency that the single-sided adhesive reflection sheet 70 does not deform so as to follow the external forms of the LEDs 52 because the ability to maintain form is too great, and the selective reflection layer 55 becomes substantially flat.

It can be said from these results that the thickness $T_{55}$ of the selective reflection layer 55 is preferably more than 12 μm and less than 200 μm ($12$ μm$<T_{55}<200$ μm), as described above.

The lighting device 3 according to the present embodiment includes the circuit substrate 51 that includes the wiring circuit, the LEDs (light sources) 52 that are mounted on the circuit substrate 51 and that emit the primary light (the blue light) in a predetermined wavelength range via the light emission surface 52A, the phosphor sheet (the wavelength conversion member) 32 that faces the light emission surface of each of the LEDs 52 and that has a function of converting part of the primary light into secondary light (red light and green light) in another wavelength range that differs from the wavelength range, and the selective reflection layer (the wavelength-selective reflection layer) 55 that is composed of dielectric multilayer film, that is disposed between the phosphor sheet 32 and the LEDs 52, that covers the light emission surface 52A of each of the LEDs 52, that allows the part of the primary light to be transmitted therethrough, and that reflects part of the secondary light. The selective reflection layer 55 is disposed so as to have the convex shapes 55P projecting in the direction opposite the direction toward the circuit substrate 51 in the regions that overlap the LEDs 52, as described above.

With the above structure, the selective reflection layer 55 has the convex shapes 55P projecting at positions at which the LEDs 52 are disposed, and the incident angle θ at which the primary light that is emitted from the LEDs 52 reaches the selective reflection layer 55 uniformly decreases unlike, for example, the model lighting devices 3M1 and 3M2 that each include the comparison selective reflection layer 55M that is substantially parallel to the circuit substrate 51 and that has a flat shape. With this structure, the incident angle θ is within a relatively narrow range, and the range of distribution can be narrowed even when the light emission surface 52A of each of the LEDs 52 and the selective reflection layer 55 are close to each other. Accordingly, the influence of the angle properties of the selective reflection layer 55 composed of dielectric multilayer film, that is, properties that cause a reflection wavelength shifts to a short wavelength depending on the incident angle θ of the primary light (the so-called blue shift) is less effective, and the luminance unevenness is inhibited from occurring. As a result, a lighting device that includes a monochromatic light source and a phosphor sheet, for example, can be thin, increase the light use efficiency, and inhibit the luminance unevenness from occurring. In particular, the present technique is useful for the lighting device 3 that uses mini LEDs as the LEDs 52 to be thin, to increase the light use efficiency, to decrease the number of the LEDs, and to decrease costs. From the perspective that the incident angle θ is decreased, and the range of distribution is narrowed, the convex shapes 55P preferably follow a spherical surface the center of which coincides the center of light emission of the respective LEDs 52.

In the lighting device 3 according to the present embodiment, the LEDs 52 are blue light-emitting diodes that emit blue light, and the phosphor sheet 32 has a function of converting part of the blue light into red light and green light. With this structure, a lighting device that is widely used to achieve high luminance and high color reproducibility can reduce the influence of the blue shift on the selective reflection layer 55, inhibit the luminance from decreasing, and decrease the luminance unevenness.

In the lighting device 3 according to the present embodiment, the protrusion height $H_{55P}$ of the convex shapes 55P is equal to the mounting height $H_{52}$ of the LEDs 52. With this structure, the selective reflection layer 55 has the convex shapes 55P following the external forms of the LEDs 52. This enables the incident angle θ to be effectively decreased, enables the range of distribution to be narrowed, and enables the luminance unevenness to be inhibited from occurring.

In the lighting device 3 according to the present embodiment, the LEDs 52 are arranged at a certain array pitch P and are mounted on the circuit substrate 51, and the distance (the optical path length OD) between the light emission surface 52A of each of the LEDs 52 and the selective reflection layer 55 is less than ½ of the array pitch P of the LEDs 52 (OD<(P/2)). When the optical path length OD is less than ½ of the array pitch P of the LEDs 52, the occurrence of the luminance unevenness is accelerated due to the influence of the angle properties of the selective reflection layer 55. The present technique can be particularly effectively used for a lighting device that has a short optical path length OD and that is likely to cause remarkable luminance unevenness.

The lighting device 3 according to the present embodiment further includes the transparent resin layer 56 that is interposed between the circuit substrate 51 and the selective reflection layer 55 and between the LEDs 52 and the selective reflection layer 55 and that secures the selective reflection layer 55 to the circuit substrate 51. With this structure, the selective reflection layer 55 is secured to the LED mounting substrate 53 in which the LEDs 52 are mounted on the circuit substrate 51 by using the transparent resin layer 56. This enables the selective reflection layer 55 to be secured to the LED mounting substrate 53 with the convex shapes 55P maintained and enables the luminance unevenness to be stably inhibited from occurring. From the perspective that the efficiency of light emission from the LEDs 52 is increased, and a large amount of light is caused to be incident on the selective reflection layer 55 to increase the luminance, the refractive index of the transparent resin layer 56 is preferably more than 1. From the perspective that the primary light that is emitted from the LEDs 52 is inhibited from diffusing in the transparent resin layer 56 and from being absorbed, and the light use efficiency of the primary light that is emitted from the LEDs 52 is increased, the degree of haze of the transparent resin layer 56 is preferably 30% or less.

In the lighting device 3 according to the present embodiment, the transparent resin layer 56 is composed of transparent, adhesive resin having adhesiveness. With this structure, the selective reflection layer 55 having no adhesiveness can be readily attached to the LED mounting substrate 53 with the selective reflection layer 55 bent. To secure the selective reflection layer 55 firmly to the LED mounting substrate 53 in which the LEDs 52 are mounted on the circuit substrate 51 such that the selective reflection layer 55 is not separated, the adhesive strength of the transparent resin layer 56 to the LED mounting substrate 53 is preferably 10 N/cm or more. The transparent resin layer 56 is preferably composed of at least a resin material selected from the group consisting of acrylic resin, epoxy resin, urethane resin, and silicone resin. This enables the transparent resin layer 56 to be appropriately formed with high transparency, a high refractive index, high adhesive strength, excellent heat resistance, and excellent light fastness.

In the lighting device 3 according to the present embodiment, the thickness $T_{56}$ of the transparent resin layer 56 is more than one time the mounting height $H_{52}$ of the LEDs 52 and less than two times the mounting height $H_{52}$ ($H_{52}<T_{56}<2H_{52}$). With this structure, the spaces around the LEDs 52 can be readily filled with the transparent resin layer 56 without any gap when the thickness $T_{56}$ of the transparent resin layer 56 is more than the mounting height $H_{52}$ of the LEDs 52. For example, in the case where the LED substrate 50 according to the present technique is produced by bonding the single-sided adhesive reflection sheet 70 to the LED mounting substrate 53 by pressure bonding, bubbles can be eliminated by the autoclave process when the thickness $T_{56}$ is more than the mounting height $H_{52}$, even in the case where the bubbles are sealed between the transparent resin layer 56 and the LEDs 52 during pressure bonding of the single-sided adhesive reflection sheet 70. The selective reflection layer 55 can be readily secured to the LED mounting substrate 53 such that the convex shapes 55P following the external forms of the LEDs 52 are formed when the thickness $T_{56}$ is less than two times the mounting height $H_{52}$.

The method of producing the LED substrate (the light source substrate) 50 according to the present embodiment includes the light source mounting step of mounting the LEDs 52 on the circuit substrate 51 that has the wiring path to manufacture the LED mounting substrate (the light source mounting substrate) 53, the single-sided adhesive, wavelength-selective reflection sheet manufacturing step of providing the adhesive resin layer 72 having adhesiveness on the single surface of the reflection sheet (the wavelength-selective reflection sheet) 71 that has no adhesiveness and that is formed by using the selective reflection layer 55 such that the thickness $T_{56}$ is no less than one time the mounting height $H_{52}$ of the LEDs 52 and no more than two times the mounting height $H_{52}$ to manufacture the single-sided adhesive reflection sheet (the single-sided adhesive, wavelength-selective reflection sheet) 70, and the wavelength-selective reflection layer attaching step of attachment to the LED mounting substrate 53 by pressure bonding such that the LEDs 52 are covered by the single-sided adhesive, wavelength-selective reflection sheet. With this feature, the single-sided adhesive reflection sheet 70 deforms so as to follow the external forms of the LEDs 52 on the LED mounting substrate 53 during pressure bonding and is attached such that the convex shapes 55P projecting in the direction opposite the direction toward the circuit substrate 51 at the positions at which the LEDs 52 are disposed are formed. As a result, the LED substrate 50 that enables the lighting device 3 to inhibit the luminance unevenness from occurring can be obtained by a very simple method.

Second Embodiment

A second embodiment will be described with reference to FIG. 8A to FIG. 9. Lighting devices 203A and 203B according to the present embodiment differ from the lighting device 3 according to the first embodiment, for example, in that light reflection layers 261 are formed on the selective reflection layer 55 of each of LED substrates 250A and 250B. In the following description, components like to those according to the first embodiment are designated by like reference signs, and a description thereof is omitted (the same is true for a third embodiment and later).

Figure 8A:
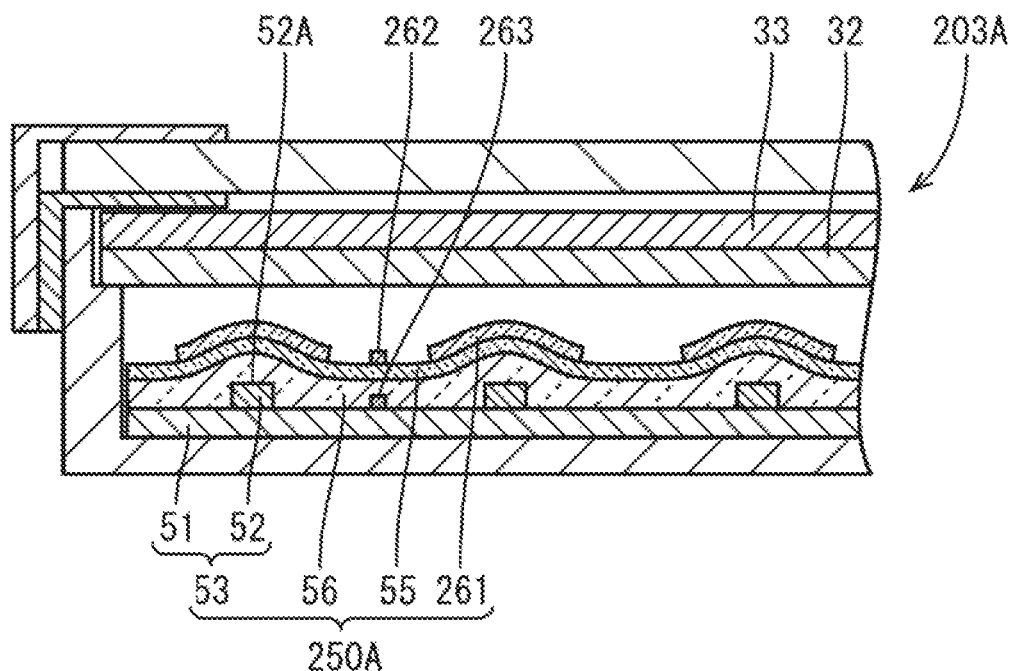
FIG. 8A schematically illustrates a sectional structure of a lighting device according to an aspect of a second embodiment.
Figure 8B:
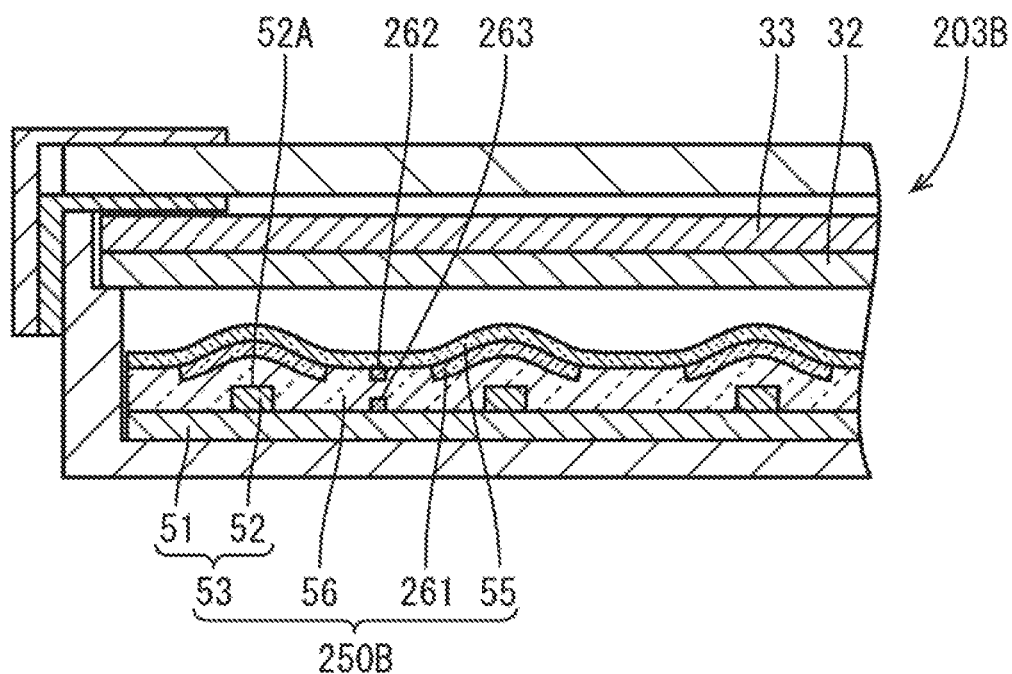
FIG. 8B schematically illustrates a sectional structure of a lighting device according to another aspect.

In the LED substrates 250A and 250B according to the second embodiment, as illustrated in FIG. 8A and FIG. 8B, the light reflection layers 261 that reflect light are formed on the selective reflection layer 55 that is wavelength-selective in the regions (the regions right above the LEDs 52) that overlap the LEDs 52. The primary light is emitted from each LED 52 such that density right above the light emission surface 52A is high, the light reflection layers 261 are accordingly disposed in such regions, the amount of light that is emitted from the LED substrates 250A and 250B toward the phosphor sheet 32 in the regions is consequently decreased, and the luminance unevenness is further decreased. When the reflectance of the light reflection layers 261 is high, and the efficiency of light shielding is too high, the regions right above the LEDs 52 are darker than the other regions, and it is accordingly preferable that the light reflection layers 261 have appropriate light transmittance. Specifically, the light reflection layers 261 preferably have a reflectance of about 60% to 95%. Here, the "reflectance" means a reflectance that is measured by a spectrophotometer in accordance with a measurement method that is defined as JIS (Japanese Industrial Standards) Z8722, and an example of the spectrophotometer can be CM-5 produced by Konica Minolta, Inc. The primary light that is emitted from the LEDs 52 hits the back surfaces of the light reflection layers 261, and secondary light that is radiated from the phosphor sheet 32 hits the front surface thereof. Accordingly, it is preferable that the light at these wavelengths be unlikely to be absorbed to maintain high light use efficiency.

The light reflection layers 261 can be composed of, for example, resin or metal. Specifically, white ink layers or thin film layers composed of, for example, aluminum or silver are preferable. The white ink layers can be formed, for example, by printing white ink with an ink-jet device or a screen, and the light reflection layers 261 having appropriate light transmittance can be readily produced by adjusting the composition or application amount of the white ink, which is preferable. Metal layers can be formed by, for example, a deposition, spattering, or photolithography method with an opening mask. In the case of the metal layers, the light transmittance of the light reflection layers 261 is preferably adjusted to be appropriate, for example, by forming fine holes in the layers.

As illustrated in FIG. 9, each light reflection layer 261 is preferably formed so as to cover the entire region right above the LED 52, in other words, the entire light emission surface 52A in a plan view of the LED substrate 250A or 250B to adjust the amount of the light that is emitted to right above the LED 52. The light reflection layer 261 is preferably larger than the external form of the LED 52 and preferably has an area three times to 80 times the area of the light emission surface 52A so as to be capable of reflecting also the primary light that is emitted to a region near and outside the light emission surface 52A in a plan view. As illustrated in FIG. 9, it is preferable that the light reflection layer 261 have a disk shape, and the center thereof is located so as to overlap the center of the light emission surface 52A. For example, in the case where the light emission surface 52A has a square shape a side of which has a length L, the light reflection layer 261 preferably has a disk shape the radius R of which is L to 5 L. This enables the amount of the primary light that is emitted from the led 52 in every direction to be effectively adjusted.

The light reflection layers 261 may be formed after or before the selective reflection layer 55 is secured to the LED mounting substrate 53. In the former case, the LED substrates 250A and 250B that include the light reflection layers 261 can be produced, for example, in a manner in which the same LED substrate 50 as in the first embodiment is formed, for example, by attaching the single-sided adhesive reflection sheet 70 to the LED mounting substrate 53, and printing, for example, is subsequently performed on the front surface of the selective reflection layer 55. In the latter case, for example, the light reflection layers 261 are formed on a single surface of the reflection sheet 71 that is used to form the selective reflection layer 55 and that has no adhesiveness, for example, by printing, and the adhesive resin layer 72 is subsequently provided on this surface to manufacture the single-sided adhesive reflection sheet that has the light reflection layers 261. The LED substrates 250A and 250B that include the light reflection layers 261 can be produced by bonding the single-sided adhesive reflection sheet to the LED mounting substrate 53. When the single-sided adhesive reflection sheet that includes the light reflection layers 261 is manufactured, the adhesive resin layer 72 may be provided on the surface of the reflection sheet 71 opposite the surface on which the light reflection layers 261 are formed or may be provided on the same surface. In the case where the adhesive resin layer 72 is provided on the surface opposite the light reflection layers 261 and is bonded, as illustrated in FIG. 8A, the lighting device 203A that includes the LED substrate 250A in which the light reflection layers 261 are disposed on the front surface of the selective reflection layer 55 can be produced. In the case where the adhesive resin layer 72 is provided on the same surface as the light reflection layers 261 and is bonded, as illustrated in FIG. 6B, the lighting device 203B that includes the LED substrate 250B in which the light reflection layers 261 are disposed on the back surface of the selective reflection layer 55 can be produced. Both of the lighting devices 203A and 203B can achieve the same effects.

In the case where the single-sided adhesive reflection sheet on which the light reflection layers 261 are formed in advance is bonded, a positioning mark 262 is preferably formed on the reflection sheet 71. When the single-sided adhesive reflection sheet is disposed on the LED mounting substrate 53 while the positioning mark 262 is referred, the positions of the light reflection layers 261 can be readily and accurately set with respect to the LEDs 52. Examples of the positioning mark 262 can include an L-shaped mark that overlaps a corner portion of each light emission surface 52A and a cross mark that represents the center of each light reflection layer 261 that overlaps the center of the light emission surface 52A. As illustrated in FIG. 9, a positioning protrusion 263 that has a cross shape and that is composed of, for example, the same material as that of the electrode pads 54 is formed at an appropriate position on the circuit substrate 51 in advance, and the center thereof may overlap the positioning mark 262. The positioning mark 262 can be formed without increasing production processes in a manner in which the positioning mark 262 is formed by using the same material as that of the light reflection layers 261, for example, at the same time the light reflection layers 261 are formed on the reflection sheet 71.

In the lighting devices 203A and 203B according to the present embodiment, the light reflection layers 261 that reflect light are formed in the regions of the selective reflection layer 55 that overlap the LEDs 52 as described above. With this structure, adjustment in the amount of the light that is radiated from right above the LEDs 52 enables the luminance unevenness in the lighting devices 203A and 203B to be decreased. It is preferable that the light reflection layers 261 be formed so as not to have complete light shielding properties but so as to allow an appropriate amount of light to be transmitted therethrough, so that locations at which the LEDs 52 are disposed become not too dark. Specifically, the reflectance of the light reflection layers 261 is preferably 60% to 95%.

In the lighting devices 203A and 203B according to the present embodiment, each light reflection layer 261 is formed so as to cover the entire light emission surface 52A of the LED 52. With this structure, the amount of the light that is emitted to right above the LED 52 is effectively adjusted, and the luminance unevenness in the lighting devices 203A and 203B can be decreased. The light reflection layer 261 is preferably formed so as to have an area three times to 80 times the area of the light emission surface 52A. For example, in the case where the light emission surface 52A has a square shape a side of which has a length L, the light reflection layer 261 preferably has a disk shape the radius R of which is L to 5 L.

In the lighting devices 203A and 203B according to the present embodiment, each light reflection layer 261 has a disk shape, and the center of the light reflection layer 261 is located so as to overlap the center of light emission of the LED 52 in a plan view of the circuit substrate 51. With this structure, the light reflection layer 261 enables the amount of the primary light that is emitted from the LED 52 in every direction to be more effectively adjusted.

In the lighting devices 203A and 203B according to the present embodiment, the selective reflection layer 55 is formed by using the reflection sheet 71 that has a sheet shape, and the reflection sheet 71 has the positioning mark 262 that is used to attach the reflection sheet 71 at a predetermined position on the circuit substrate 51 and that is formed by using the same material as that of each light reflection layer 261. With this structure, accurate positioning enables the reflection sheet 71 to be attached to the LED mounting substrate 53 such that each light reflection layer 261 is disposed at a desired position with respect to the light emission surface 52A of the LED 52. The positioning mark 262 is preferably formed on the reflection sheet 71 by using the same material as that of the light reflection layer 261 at the same time.

Third Embodiment

A third embodiment will be described with reference to FIG. 10 to FIG. 11B. A lighting device 303 according to the present embodiment differs from the lighting device 3 according to the first embodiment in that a LED substrate 350 further includes a transparent base material 365 and another transparent resin layer 366 composed of adhesive resin that is transparent.

Figure 10:
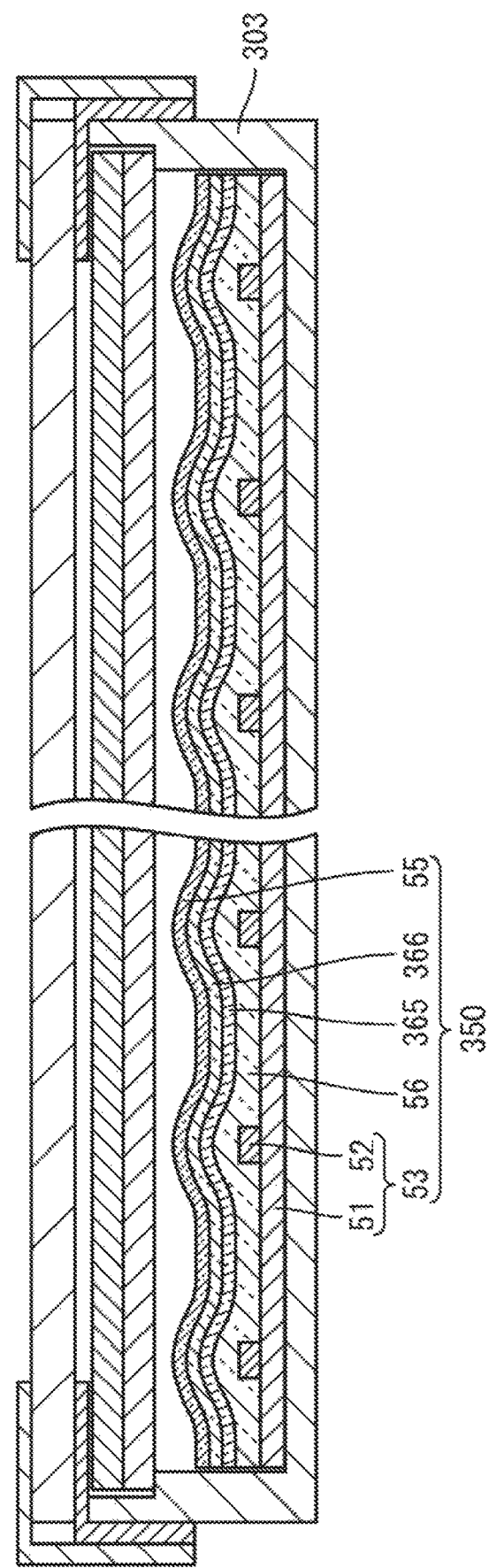
FIG. 10 schematically illustrates a sectional structure of a lighting device according to a third embodiment.

In the LED substrate 350 according to the third embodiment, as illustrated in FIG. 10, the selective reflection layer 55 is disposed above the LED mounting substrate 53 with the transparent base material 365 interposed therebetween. The selective reflection layer 55 has a special function of reflecting (transmitting) light at a different rate depending on the wavelength of the light, certain restrictions are accordingly imposed on the thickness $T_{55}$ and hardness thereof, and it is difficult for the selective reflection layer 55 to be disposed such that the convex shapes 55P are desirably formed by adjusting the ability to maintain form (flexibility) in some cases. In view of this, according to the present embodiment, interposing the transparent base material 365 makes it easy to dispose the selective reflection layer 55 in a desired state.

The transparent base material 365 does not have a special optical function but preferably has high light transmittance. The transparent base material 365 is preferably a support body that has appropriate ability to maintain form and that can readily adjust thickness and hardness. The transparent base material 365 can be composed of, for example, PET film.

Figure 11A:
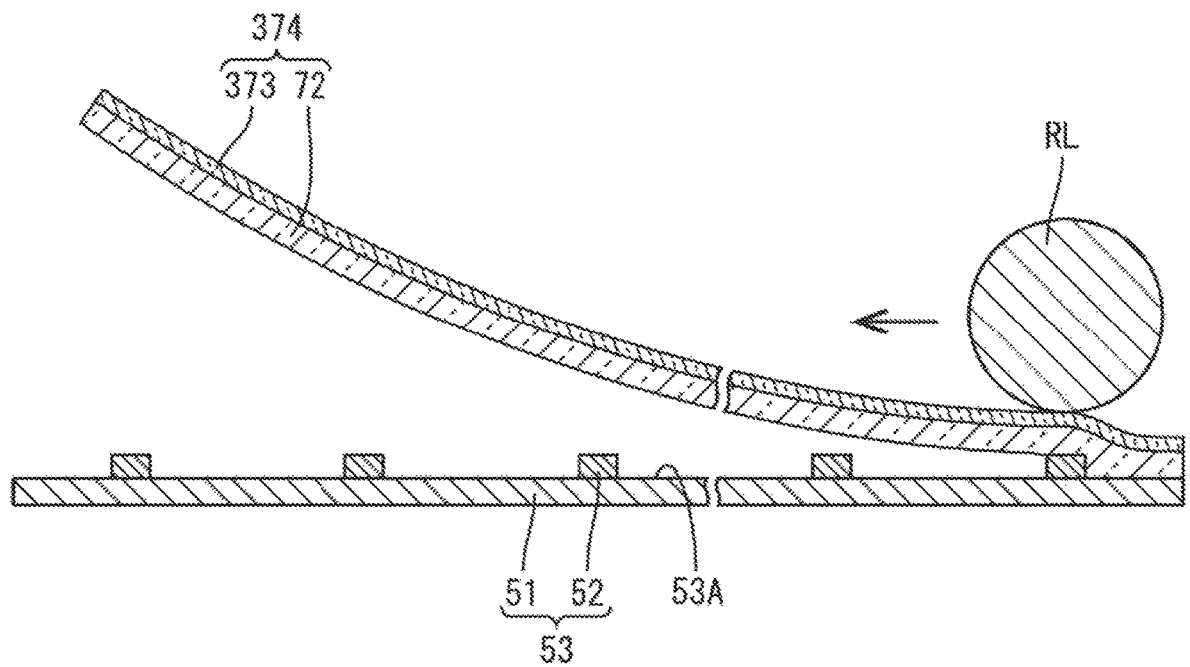
FIG. 11A illustrates an example of a step of attaching a single-sided adhesive, transparent base material sheet.
Figure 11B:
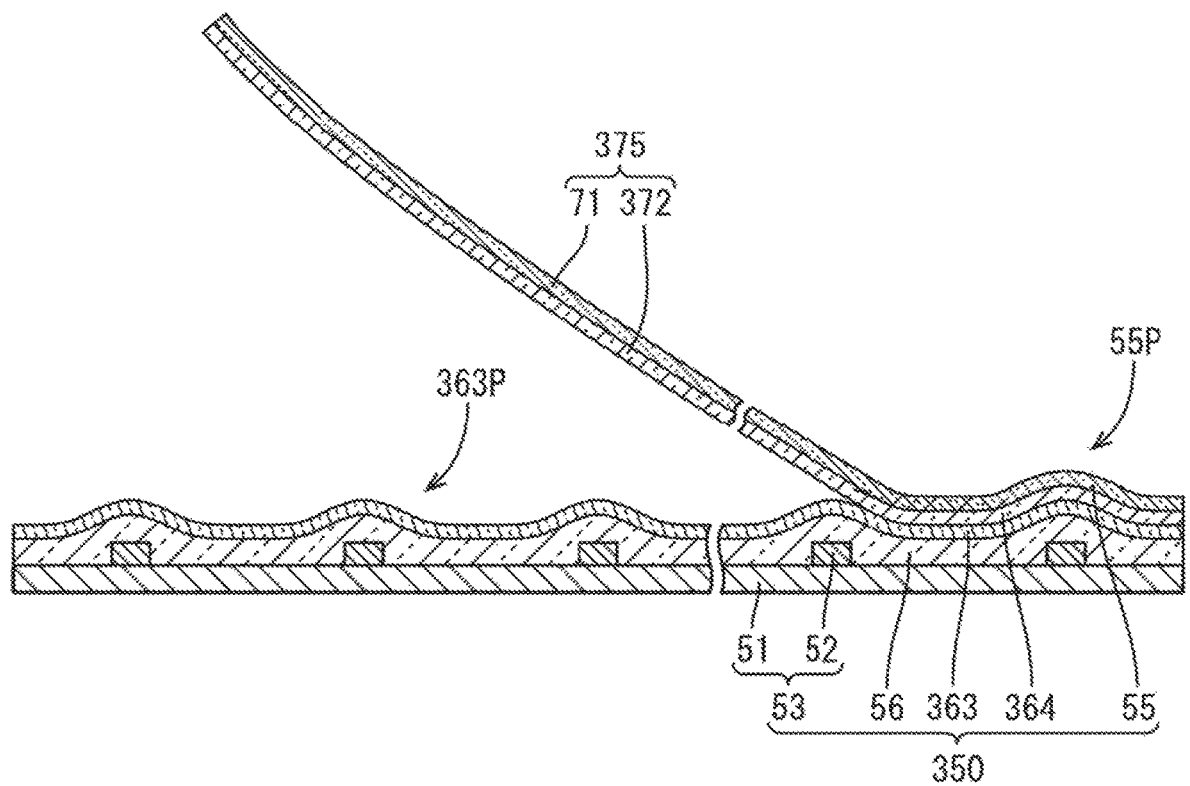
FIG. 11B illustrates an example of a step of attaching a single-sided adhesive reflection sheet.

The LED substrate 350 according to the present embodiment can be produced, for example, in the following manner. Transparent resin having adhesiveness is applied with substantially uniform thickness to a single surface of a transparent base material sheet 373 that has no adhesiveness and that has appropriate thickness and hardness, the adhesive resin layer 72 that is used to form the transparent resin layer 56 is formed to manufacture a single-sided adhesive, transparent base material sheet 374 illustrated in FIG. 11A (a single-sided adhesive, transparent base material sheet manufacturing step). The adhesive resin layer 72 is preferably formed such that the thickness is more than the mounting height $H_{52}$ of the LEDs 52 and is less than two times the mounting height $H_{52}$. The reason is that in this case, the thickness $T_{56}$ of the transparent resin layer 56 satisfies $H_{52} < T_{56} < 2H_{52}$, bubbles are inhibited from being introduced into the LED substrate 50, and the transparent base material 365 can be readily provided such that convex shapes 365P describe later are formed. As illustrated in FIG. 11A, the single-sided adhesive, transparent base material sheet 374 is placed on the mounting surface 53A of the LED mounting substrate 53 that is manufactured in the same LED mounting step as in the first embodiment such that the adhesive resin layer 72 faces downward (in the direction toward the LED mounting substrate 53), and the single-sided adhesive, transparent base material sheet 374 is attached by pressure bonding in a manner in which the spaces between the LEDs 52 are sealed with the adhesive resin while the adhesive resin layer 72 is deformed by, for example, the roller RL, and air is pushed out. In the case where bubbles remain between the adhesive resin layer 72 and the LEDs 52 or the mounting surface 53A, the bubbles can be eliminated by performing the autoclave process in appropriate conditions. Consequently, the transparent resin layer 56 that is formed by using the adhesive resin layer 72 that is transparent is provided such that each LED 52 is embedded on the mounting surface 53A of the LED mounting substrate 53, and the transparent base material 365 that is formed by using the transparent base material sheet 373 is secured to the surface thereof with the convex shapes 365P formed (a transparent base material attaching step).

Subsequently, for example, adhesive resin that is transparent is applied to a single surface of the reflection sheet 71 that has no adhesiveness and that is used to form the selective reflection layer 55, and another adhesive resin layer 372 is formed to manufacture a single-sided adhesive reflection sheet (a single-sided adhesive, wavelength-selective reflection sheet) 375 illustrated in FIG. 11B. The adhesive resin of which the other adhesive resin layer 372 is composed can be relatively freely selected from resin that has high light transmittance and high adhesiveness and may be the same as the adhesive resin of which the adhesive resin layer 72 is composed, or may be different resin. The thickness of the other adhesive resin layer 372 can be freely designed, and the other adhesive resin layer 372 is preferably relatively thin from the perspective that the light transmittance is inhibited from decreasing and followability to the transparent base material 365 is increased. As illustrated in FIG. 11B, a surface of the other adhesive resin layer 372 of the single-sided adhesive reflection sheet 375 is bonded to the transparent base material 365 that is secured to the LED mounting substrate 53. The selective reflection layer 55 that is formed by using the reflection sheet 71 is provided above the surface of the transparent base material 365 in the front surface direction with the other transparent resin layer 366 that is formed by using the other adhesive resin layer 372 interposed therebetween and with the convex shapes 55P formed along the convex shapes 365P (a wavelength-selective reflection layer providing step). The selective reflection layer 55 is not limited to the selective reflection layer that is secured with the other adhesive resin layer 372 interposed therebetween and that is formed by using the reflection sheet 71 and may be directly formed on the upper surface of the transparent base material 365 (the LED substrate may not include the other transparent resin layer 366).

The lighting device 303 according to the present embodiment further includes the transparent base material 365 that is interposed between the transparent resin layer 56 and the selective reflection layer 55 as described above. It is difficult to freely determine the thickness and hardness of the selective reflection layer 55 due to restrictions on the function and the producing method, and it is difficult for the selective reflection layer 55 to have a desired shape in some cases. However, as for the transparent base material 365, which does not have a special function and can have a thickness and hardness that are freely adjusted, a transparent base material that has appropriate ability to maintain form (flexibility) is selected and can be relatively readily disposed so as to have a desired shape. Accordingly, the structure according to the present embodiment enables the selective reflection layer 55 that has a desired shape to be readily disposed by interposing the transparent base material 365 that is appropriately bent and by disposing the selective reflection layer 55 along this. The selective reflection layer 55 according to the present embodiment is secured to the transparent base material 365 that has a predetermined shape with the other transparent resin layer 366 interposed therebetween.

The method of producing the LED substrate 350 according to the present embodiment includes the LED mounting step of mounting the LEDs 52 on the circuit substrate 51 that has the wiring path to manufacture the LED mounting substrate 53, the single-sided adhesive, transparent base material sheet manufacturing step of providing the adhesive resin layer 72 having adhesiveness on the single surface of the transparent base material sheet 373 having no adhesiveness such that the thickness is no less than one time the mounting height $H_{52}$ of the LEDs 52 and no more than two times the mounting height $H_{52}$ to manufacture the single-sided adhesive, transparent base material sheet 374, the transparent base material attaching step of attaching the single-sided adhesive, transparent base material sheet 374 to the LED mounting substrate 53 by pressure bonding such that the single-sided adhesive, transparent base material sheet covers the LEDs 52, and the wavelength-selective reflection layer providing step of providing the selective reflection layer 55 above the transparent base material sheet 373 that is attached to the LED mounting substrate 53. In this way, the single-sided adhesive, transparent base material sheet 374 deforms so as to follow the external forms of the LEDs 52, is attached to the LED mounting substrate 53 by pressure bonding, and is secured such that the convex shapes 365P projecting in the direction opposite the direction toward the circuit substrate 51 in regions in which the transparent base material 365 overlaps the LEDs 52 are formed. Subsequently, the selective reflection layer 55 is provided above the transparent base material 365, and the LED substrate 350 in which the selective reflection layer 55 is held with the convex shapes 55P formed along the convex shapes 365P can be consequently obtained. According to the present embodiment, the selective reflection layer 55 is secured to the transparent base material 365 by attaching the single-sided adhesive reflection sheet 375 in which the other adhesive resin layer 372 is formed on a single surface of the reflection sheet 71.

Fourth Embodiment

Figure 12A:
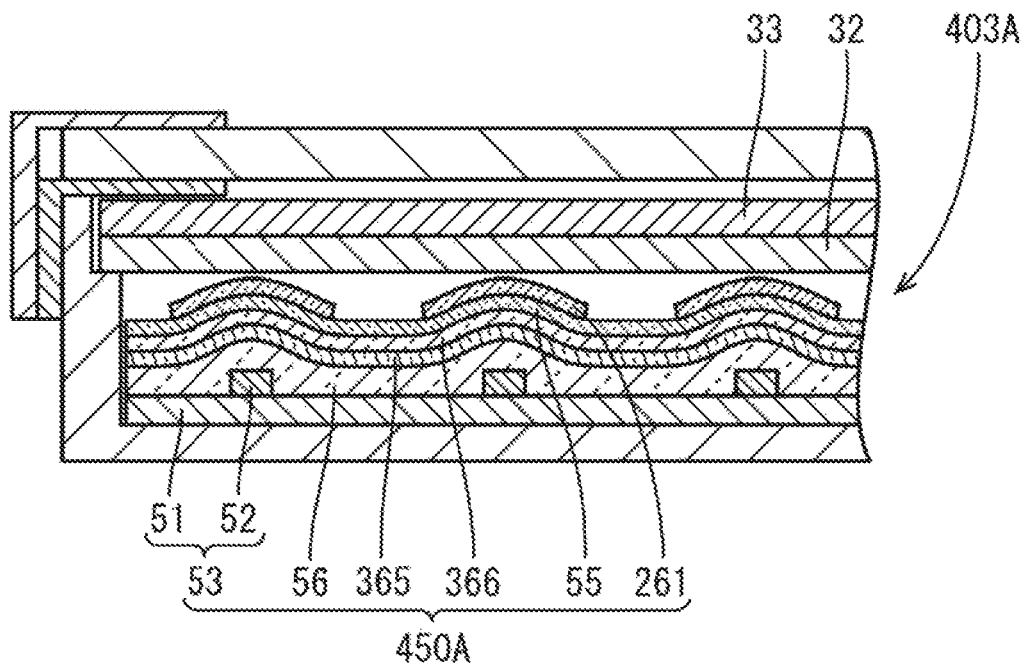
FIG. 12A schematically illustrates a sectional structure of a lighting device according to an aspect of a fourth embodiment.
Figure 12B:
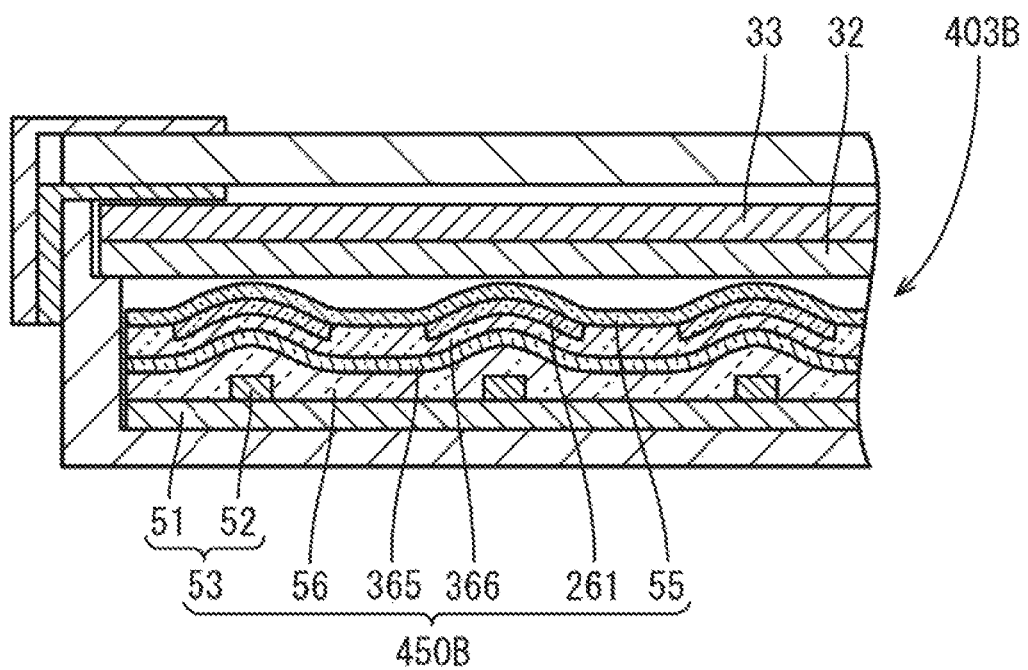
FIG. 12B schematically illustrates a sectional structure of a lighting device according to another aspect.

A fourth embodiment will be described with reference to FIG. 12A and FIG. 12B. Lighting devices 403A and 403B according to the present embodiment differ from the lighting device 303 according to the third embodiment in that the light reflection layers 261 that are the same as in second embodiment are formed on the selective reflection layer 55 of each of LED substrates 450A and 450B.

What the LED substrates 450A and 450B according to the present embodiment and the LED substrate 350 according to the third embodiment have in common is that the transparent base material 365 is secured to the LED mounting substrate 53 with the transparent resin layer 56 interposed therebetween such that convex shapes are formed, and the selective reflection layer 55 is secured to the transparent base material 365 with the other transparent resin layer 366 interposed therebetween. The light reflection layers 261 according to the present embodiment may be formed after or before the selective reflection layer 55 is secured to the transparent base material 365. In the latter case, for example, the light reflection layers 261 are formed on a single surface of the reflection sheet 71, and the other adhesive resin layer 372 is subsequently provided on the single surface to manufacture a single-sided adhesive reflection sheet that, includes the light reflection layers 261. The single-sided adhesive reflection sheet is attached to the transparent base material 365 that is secured by attaching the single-sided adhesive, transparent base material sheet 374 to the LED mounting substrate 53 in advance as in the third embodiment. In this way, the LED substrates 450A and 450B in which the selective reflection layer 55 including the light reflection layers 261 are secured so as to nave a shape following the transparent base material 365 can be obtained. In the case where the other adhesive resin layer 372 is provided on the surface opposite the light reflection layers 261 and is bonded, as illustrated in FIG. 12A, the lighting device 403A that includes the LED substrate 450A in which the light reflection layers 261 are disposed on the front surface of the selective reflection layer 55 can be produced. In the case where the other adhesive resin layer 372 is provided on the same surface as the light reflection layers 261 and is bonded, as illustrated in FIG. 12B, the lighting device 403B that includes the LED substrate 450B in which the light reflection layers 261 are disposed on the back surface of the selective reflection layer 55 can be produced.

In the lighting devices 403A and 403B according to the present embodiment, the light reflection layers 261 that reflect light are formed in the regions of the selective reflection layer 55 that overlap the LEDs 52 as described above. In each of the lighting devices 403A and 403B with this structure, the selective reflection layer 55 can be readily disposed so as to have a desired shape with the transparent base material 365 interposed therebetween, and the light reflection layers 261 enable the amount of the light that is radiated from right above the LEDs 52 to be adjusted and enable the luminance unevenness to be decreased.

Fifth Embodiment

Figure 13A:
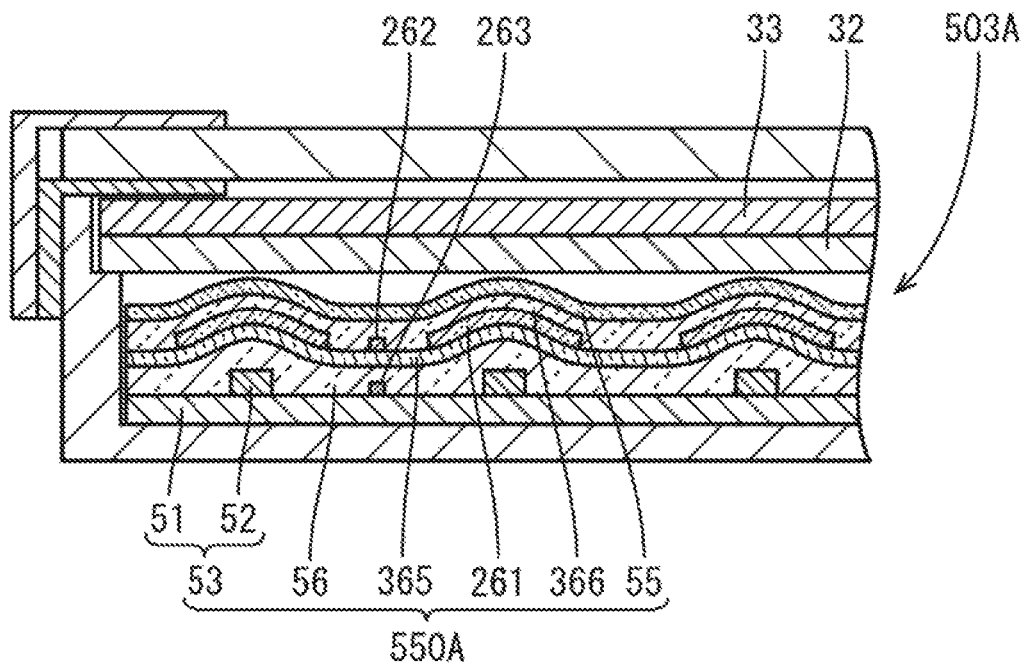
FIG. 13A schematically illustrates a sectional structure of a lighting device according to an aspect of a fifth embodiment.
Figure 13B:
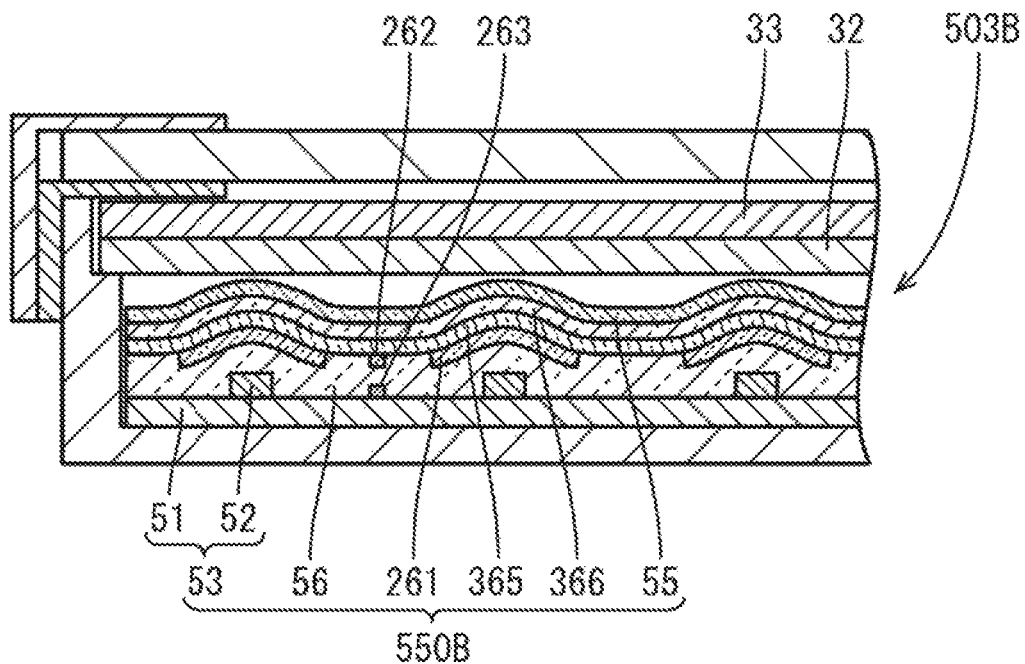
FIG. 13B schematically illustrates a sectional structure of a lighting device according to another aspect.

A fifth embodiment will be described with reference to FIG. 13A and FIG. 13B. Lighting devices 503A and 503B according to the present embodiment differ from the lighting device 303 according to the third embodiment in that the light reflection layers 261 that are the same as in the second embodiment are formed on the transparent base material 365 of each of LED substrates 550A and 550B.

Similarly, what the LED substrates 550A and 550B according to the present embodiment and the LED substrate 350 according to the third embodiment have in common is that the transparent base material 365 is secured to the LED mounting substrate 53 with the transparent resin layer 56 interposed therebetween such that convex shapes are formed, and the selective reflection layer 55 is secured to the transparent base material 365 with the other transparent resin layer 366 interposed therebetween. The light reflection layers 261 according to the present embodiment may be formed after or before the transparent base material 365 is secured to the LED mounting substrate 53. In the latter case, for example, the light reflection layers 261 are formed on a single surface of the transparent base material sheet 373, and the adhesive resin layer 72 is subsequently provided on the single surface to manufacture a single-sided adhesive, transparent base material sheet that includes the light reflection layers 261. The transparent base material 365 on which the light reflection layers 261 are formed is secured with the transparent resin layer 56 interposed therebetween by attaching the single-sided adhesive, transparent base material sheet to the LED mounting substrate 53. The single-sided adhesive reflection sheet 375 is attached to the transparent base material 365 as in the third embodiment, and the LED substrates 550A and 550B in which the transparent base material 365 including the light reflection layers 261 are disposed between the LED mounting substrate 53 and the selective reflection layer 55 can be consequently obtained. In the case where the adhesive resin layer 72 is provided on the surface opposite the light reflection layers 261 and is bonded, as illustrated in FIG. 13A, the lighting device 503A that includes the LED substrate 550A in which the light reflection layers 261 are disposed on the front surface of the transparent base material 365 can be produced. In the case where the adhesive resin layer 72 is provided on the same surface as the light reflection layers 261 and is bonded, as illustrated in FIG. 13B, the lighting device 503B that includes the LED substrate 550B in which the light reflection layers 261 are disposed on the back surface of the transparent base material 365 can be produced.

When the LED substrates 550A and 550B are produced, the positioning mark 262 described according to the second embodiment is preferably provided at the same time the light reflection layers 261 are formed on the single surface of the transparent base material sheet 373. In the case where the LED substrates are produced by binding the single-sided adhesive, transparent base material sheet or the single-sided adhesive reflection sheet, particularly, in the case of the structure including the light reflection layers 261, it is effective to form the positioning mark 262 in advance on a sheet that has the light reflection layers 261 to dispose this at predetermined positions with respect to the LEDs 52. However, the reflection sheet 71 reflects a specific wavelength, and the positioning mark 262 that is formed on this is unlikely to be recognized during attaching operation, and the accuracy of positioning decreases. As for a structure in which the transparent base material sheet 373 has the positioning mark 262 as in the present embodiment, visibility during attaching is not reduced by wavelength-selective reflection, and the attaching operation can be rapidly performed with high precision.

In the lighting devices 503A and 503B according to the present embodiment, the light reflection layers 261 that reflect light, are formed in the regions of the transparent base material 365 that overlap the LEDs 52 as described above. In each of the lighting devices 503A and 503B with this structure, the selective reflection layer 55 can be readily disposed so as to have a desired shape with the transparent base material 365 interposed therebetween, and the light reflection layers 261 enable the amount of the light that is radiated from right above the LEDs 52 to be adjusted and enable the luminance unevenness to be decreased. The transparent base material 365 can be readily and accurately secured to the LED mounting substrate 53 by forming the positioning mark 262 on the transparent base material sheet 373 that is used to form the transparent base material 365.

The present technique is described above in detail according to the embodiments, which are described by way of example and do not limit the scope of Claims. Techniques recited in Claims include techniques obtained by modifying and altering specific examples that are described according to the embodiments in various ways.

What is claimed is:
1. A lighting device comprising:
a circuit substrate that includes a wiring circuit;

a light source that is mounted on the circuit substrate and that emits primary light in a predetermined wavelength range via a light emission surface;

a wavelength conversion member that faces the light emission surface of the light source and that converts part of the primary light into secondary light in another wavelength range that differs from the predetermined wavelength range; and a wavelength-selective reflection layer that (i) is disposed between the wavelength conversion member and the light source, (ii) covers the light emission surface of the light source, (iii) allows the part of the primary light to be transmitted therethrough, and (iv) reflects part of the secondary light, wherein the wavelength-selective reflection layer is disposed such that a convex shape projects in a direction opposite a direction toward the circuit substrate in a region that overlaps the light source, wherein a light reflection layer that reflects light is formed on the wavelength-selective reflection layer in the region that overlaps the light source.

2. The lighting device according to claim 1, wherein the light source is a blue light-emitting diode that emits blue light, and wherein the wavelength conversion member converts part of the blue light into red light and green light.

3. The lighting device according to claim 1, wherein a protrusion height of the convex shape is equal to a mounting height of the light source.

4. The lighting device according to claim 1, wherein a plurality of the light sources is arranged at a certain array pitch and is mounted on the circuit substrate, and a distance between the light emission surface of each of the plurality of the light sources and the wavelength-selective reflection layer is less than ½ of the array pitch of the plurality of the light sources.

5. The lighting device according to claim 1, further comprising:

a transparent resin layer that is interposed between the circuit substrate and the wavelength-selective reflection layer and between the light source and the wavelength-selective reflection layer and that secures the wavelength-selective reflection layer to the circuit substrate.

6. The lighting device according to claim 5, wherein the transparent resin layer is composed of transparent and adhesive resin having adhesiveness.

7. The lighting device according to claim 5, wherein a thickness of the transparent resin layer is more than one times a mounting height of the light source and less than two times the mounting height.

* * * * *